US008064982B2

(12) United States Patent
Hu et al.

(10) Patent No.: US 8,064,982 B2
(45) Date of Patent: Nov. 22, 2011

(54) METHODS FOR MAGNETIC RESONANCE ANALYSIS USING MAGIC ANGLE TECHNIQUE

(75) Inventors: Jian Zhi Hu, Richland, WA (US); Robert A. Wind, Kennewick, WA (US); Kevin R. Minard, Kennewick, WA (US); Paul D. Majors, Kennewick, WA (US)

(73) Assignee: Battelle Memorial Institute, Richland, WA (US)

( * ) Notice: Subject to any disclaimer, the term of this patent is extended or adjusted under 35 U.S.C. 154(b) by 578 days.

(21) Appl. No.: 11/562,390

(22) Filed: Nov. 21, 2006

(65) Prior Publication Data

US 2008/0116889 A1 May 22, 2008

(51) Int. Cl.
*A61B 5/055* (2006.01)
(52) U.S. Cl. ........ 600/410; 600/407; 324/307; 324/309; 324/314
(58) Field of Classification Search .................. 600/410, 600/407; 324/307, 309, 314
See application file for complete search history.

(56) References Cited

U.S. PATENT DOCUMENTS

| | | | | |
|---|---|---|---|---|
| 4,301,410 A * | 11/1981 | Wind et al. | .................... | 324/307 |
| 4,319,190 A | 3/1982 | Brown | | |
| 4,352,066 A * | 9/1982 | Kendrick et al. | ............. | 324/321 |
| 4,511,841 A * | 4/1985 | Bartuska et al. | ............. | 324/321 |
| 4,654,593 A | 3/1987 | Ackerman | | |
| 4,689,566 A | 8/1987 | Maudsley | | |
| 5,208,536 A * | 5/1993 | Cory | ............................. | 324/321 |
| 5,227,725 A * | 7/1993 | Cory et al. | .................... | 324/309 |
| 5,260,657 A * | 11/1993 | Lewis et al. | .................... | 324/321 |
| 5,327,085 A * | 7/1994 | Cory | ............................. | 324/307 |
| 5,872,452 A * | 2/1999 | Cory et al. | .................... | 324/321 |
| 6,133,733 A * | 10/2000 | Lurie et al. | .................... | 324/300 |
| 6,275,037 B1 * | 8/2001 | Harvey et al. | ................. | 324/309 |
| 6,332,088 B1 * | 12/2001 | Zhang et al. | .................. | 600/410 |
| 6,477,398 B1 * | 11/2002 | Mills | ............................ | 600/409 |
| 6,653,832 B2 | 11/2003 | Wind et al. | | |
| 6,670,811 B2 | 12/2003 | Wind et al. | | |
| 6,836,113 B2 * | 12/2004 | Zhang | ........................... | 324/307 |
| 6,836,115 B2 | 12/2004 | Wind et al. | | |
| 2002/0125887 A1 * | 9/2002 | Wind et al. | .................... | 324/307 |

(Continued)

OTHER PUBLICATIONS

Cohen, "Echo-planar imaging (EPI) and functional MRI," 17p., downloaded from http://airto.bmap.ucla.edu/BMCweb?BMC_BIOS?MarkCohen/Papers/EP... on Nov. 9, 2006.

(Continued)

*Primary Examiner* — Tse Chen
*Assistant Examiner* — Mark Remaly
(74) *Attorney, Agent, or Firm* — Klarquist Sparkman, LLP

(57) ABSTRACT

Methods of performing a magnetic resonance analysis of a biological object are disclosed that include placing the object in a main magnetic field (that has a static field direction) and in a radio frequency field; rotating the object at a frequency of less than about 100 Hz around an axis positioned at an angle of about 54°44' relative to the main magnetic static field direction; pulsing the radio frequency to provide a sequence that includes a phase-corrected magic angle turning pulse segment; and collecting data generated by the pulsed radio frequency. In particular embodiments the method includes pulsing the radio frequency to provide at least two of a spatially selective read pulse, a spatially selective phase pulse, and a spatially selective storage pulse. Further disclosed methods provide pulse sequences that provide extended imaging capabilities, such as chemical shift imaging or multiple-voxel data acquisition.

29 Claims, 27 Drawing Sheets

U.S. PATENT DOCUMENTS

2002/0135365 A1* 9/2002 Wind et al. .................. 324/307
2005/0035766 A1* 2/2005 Wind et al. .................. 324/322

OTHER PUBLICATIONS

DeLaPaz, "Echo-planar Imaging," *Scientific Exhibit* 14(5):1045-1058 (Sep. 1994).

"Echo planar imaging on high field microimaging systems," 8p., downloaded from http://www.ias.ac.in/currsci/mar25/articles24.htm on Nov. 9, 2006.

Price, "Pulsed-Field Gradient Nuclear Magnetic Resonance as a Tool for Studying Translational Diffusion: Part 1. Basic Theory," *Water Research Institute* 299-236 (Jul. 18, 1996).

Stallmach, "Fundamentals of Pulsed Field Gradient Nuclear Magnetic Resonance/PFG NMR Studies with Ultra-High Intensity Magnetic Field Gradients," *International Research Training Group* 1-26 (Dec. 9-10, 2004).

Wind, et al., "Localized in vivo isotropic-anisotropic correlation 1H NMR spectroscopy using ultraslow angle spinning," *Magnetic Resonance in Medecine* 55(1):41-49 (Jan. 2006).

\* cited by examiner (a): RF pulses (b): Gradients (c): RF spectrum

METHODS FOR MAGNETIC RESONANCE ANALYSIS USING MAGIC ANGLE TECHNIQUE

STATEMENT OF GOVERNMENT SUPPORT

This invention was made with United States Government support under Contract DE-AC0676RLO1830 and Grant 22342 KP-14-02-01 awarded by the U.S. Department of Energy, by the National Institute of Biomedical Imaging and Bioengineering under Grant 5 R21 EB003293, and by Pacific Northwest National Laboratory Directed Research and Development (LDRD) and Individual Research and Development (IR&D). The United States Government has certain rights in the invention.

FIELD

The present disclosure relates to magnetic resonance (MR) analysis, particularly to magnetic resonance spectroscopy (MRS) and imaging (MRI) of biological objects.

BACKGROUND

Magnetic resonance is a phenomenon exhibited by a select group of atomic nuclei and is based upon the existence of nuclear magnetic moments in these nuclei (termed "gyromagnetic" nuclei). When a gyromagnetic nucleus is placed in a strong, uniform and steady magnetic field (a so-called "external field" and referred to herein as a "static" magnetic field), it precesses at a natural frequency known as a Larmor frequency. The Larmor frequency is characteristic of each nuclear type and is dependent on the applied field strength in the location of the nucleus. Typical gyromagnetic nuclei include $^1H$ (protons), $^{13}C$, $^{19}F$ and $^{31}P$. The precession frequencies of the nuclei can be observed by monitoring the transverse magnetization that results after a strong RF pulse applied at or near their Larmor frequencies. It is common practice to convert the measured signal to a frequency spectrum by means of Fourier transformation.

More specifically, when a bulk sample containing nuclear magnetic resonance (NMR) active nuclei is placed within a magnetic field, the nuclear spins distribute themselves amongst the nuclear magnetic energy levels in accordance with Boltzmann's statistics. This results in a population imbalance between the energy levels and a net nuclear magnetization. It is this net nuclear magnetization that is studied by NMR techniques.

At equilibrium, the net nuclear magnetization is aligned parallel to the external magnetic field and is static. A second magnetic field perpendicular to the first and rotating at, or near, the Larmor frequency can be applied to induce a coherent motion of the net nuclear magnetization. Since, at conventional field strengths, the Larmor frequency is in the megahertz frequency range, this second field is called a "radio frequency" or RF field.

In particular, a short (microsecond) pulse of RF radiation is applied to the sample in the static magnetic field; this pulse is equivalent to irradiating at a range of frequencies. The free induction decay (FID) in response to the RF pulse is measured as a function of time. The response of the sample to the pulse depends upon the RF energy absorption of the sample over a range of frequencies applied (for example, 500 MHz±2500 Hz). Often the pulse is applied many times and the results are averaged to improve the signal-to-noise ratio.

The coherent motion of the nuclear magnetization about the RF field is called a "nutation." In order to deal conveniently with this nutation, a reference frame is used which rotates about the z-axis at the Larmor frequency. In this "rotating frame" part of the RF field, which is rotating in the stationary "laboratory" reference frame in the same direction as the magnetization, is static. Consequently, the effect of the RF field is to rotate the nuclear magnetization direction at an angle with respect to the main static field direction. By convention, an RF field pulse of sufficient length to rotate the nuclear magnetization through an angle of 90° or $\pi/2$ radians is called a "$\pi/2$ pulse."

A $\pi/2$ pulse applied with a frequency near the nuclear resonance frequency will rotate the spin magnetization from an original direction along the main static magnetic field direction into a plane perpendicular to the main magnetic field direction. The component of the net magnetization that is transverse to the main magnetic field precesses about the main magnetic field at the Larmor frequency. This precession can be detected with a receiver coil that is resonant at the precession frequency and located such that the precessing magnetization induces a voltage across the coil. Frequently, the "transmitter coil" employed for generating the RF field to the sample and the "receiver coil" employed for detecting the magnetization are one and the same coil.

In addition to precessing at the Larmor frequency, in the absence of the applied RF field, the nuclear magnetization also undergoes two relaxation processes: (1) the precessions of various individual nuclear spins which generate the net nuclear magnetization become dephased with respect to each other so that the magnetization within the transverse plane loses phase coherence (so-called "spin-spin relaxation") with an associated relaxation time, $T_2$, and (2) the individual nuclear spins return to their equilibrium population of the nuclear magnetic energy levels (so-called "spin-lattice relaxation") with an associated relaxation time, $T_1$. The spin-spin relaxation is caused by the presence of small local magnetic fields, arising from the electrons, magnetic nuclei, and other magnetic dipoles surrounding a particular nucleus. These fields cause slight variations in the resonance frequency of the individual nuclei, which results in a broadening of the NMR resonance line. Often this broadening is caused by two types of local fields: a static component, which gives rise to a so-called inhomogeneous broadening, and local fields which are fluctuating in time as a result of molecular motions and interactions between magnetic nuclei. The latter phenomenon results in a so-called homogeneous broadening.

Magnetic resonance imaging and magnetic resonance spectroscopy are used extensively in biological research and medicine, both for in vitro investigations of cells and tissues and for in vivo measurements on animals and humans. Both methods are non-invasive and non-destructive and are used for a large variety of applications, including the detection and diagnosis of lesions and diseases, and the evaluation of therapy response. One particularly useful MRS technique is $^1H$ nuclear magnetic resonance (NMR) spectroscopy. $^1H$ NMR spectroscopy has been used extensively to study metabolic changes in diseased cells and tissues and the effects of therapy. The resonance lines corresponding to several key mobile compounds have been observed, and their spectral intensities have been linked to the tumor phenotype, tumorigenesis, tumor size, increased proliferation of cells, cell apoptosis, and necrosis.

However, a serious typically problem associated with these applications is the relatively large widths of the MR resonance lines that are observed using conventional MRI and MRS. This reduces the MRI and MRS sensitivity, and, for MRS, can result in severely overlapping spectral lines, which can impede the analysis of the spectrum. It has been established that in biological materials the line widths are mainly caused by inhomogeneous broadening. In intact cells and tissues, the possible mechanisms that broaden the lines inhomogeneously include residual chemical shift anisotropy interaction and local magnetic field gradients arising from variations in the bulk magnetic susceptibility at the various compartment boundaries present in the cells and tissues. It is believed in the art that the bulk magnetic susceptibility variations are the main mechanisms responsible for the broadening. Using cell extracts can eliminate this broadening, but this procedure cannot be applied in live subjects, it is time consuming and may introduce spectral artifacts.

It is well known that the susceptibility broadening and other inhomogeneous broadening mechanisms can be eliminated by magic angle spinning (MAS), where the sample is rotated about an axis with an angle of 54° 44' (or $\cos^{-1}(3^{-1/2})$) with respect to the static magnetic field direction. A problem with MAS is that when the value of the spinning rate is small compared to the width of the broadening, the resonant peak splits into a group of spinning sidebands (SSBs) separated by the spinning rate. If the value of the spinning rate is less than the isotropic spectral width, the analysis of the spectra becomes considerably difficult due to the overlapping of the SSBs associated with the different resonant peaks. This problem can be avoided by increasing the spinning rate to eliminate the SSBs in the spectral region of interest. Indeed it has been shown that fast MAS, where a sample is rotated at a speed of several kHz, produces a significant narrowing of the MR lines in cells and tissues (see Weybright et al., *Gradient, High-Resolution, Magic Angle Spinning $^1H$ Nuclear Magnetic Resonance Spectroscopy of Intact Cells*, Magnetic Resonance in Medicine 1998; 39: 337-345; and Cheng et al., *Quantitative Neuropathology by High Resolution Magic Angle Spinning Proton Magnetic Resonance Spectroscopy*, Proc. Natl. Acad. Sci. USA 1997; 94: 6408-6413). However, the large centrifugal force associated with such high spinning rates destroys the tissue structure and even part of the cells (see Weybright et al.). Consequently, MAS at a high spinning speed is not suitable, for example, to map the metabolite distribution in intact biological tissues or to study live cells, and is impossible to use on live subjects.

A possible way to overcome the problems associated with fast MAS is to use slow sample spinning. Many methods have been developed in solid state NMR to eliminate the spinning sidebands or to separate them from the isotropic spectrum so that a sideband free isotropic chemical shift spectrum is obtained. One approach is the so-called magic angle turning (MAT) techniques, and sideband free isotropic chemical shift spectra have been obtained in solids at spinning rates as low as 30 Hz (Hu et al., *Magic Angle Turning and Hopping*, in Encyclopedia of Magnetic Resonance D. M. Grant, and R. K. Harris, Eds. New York: John Wiley & Sons: 1996, 2914-2921).

MAT is a two dimensional (2D) NMR technique that was developed to determine the chemical shift tensors of rare spins such as $^{13}C$ and $^{15}N$ in solids. There are basically two types of MAT experiments. The first type (MAT-1) is based on the Magic Angle Hopping (MAH) experiment pioneered by Bax et al., *Correlation of Isotropic Shifts and Chemical Shift Anisotropies by Two-Dimensional Fourier-Transform Magic-Angle Hopping NMR Spectroscopy*, J. Magn. Reson. 1983; 52: 147. The second class (MAT-2) involves the use of five radio frequency π pulses during a constant evolution time period (e.g., one rotor period). MAT-2 techniques include the five π replicated magic angle turning (FIREMAT) (Hu et al., *An Isotropic Chemical Shift-Chemical Shift Anisotropy Magic Angle Slow-Spinning 2D NMR Experiment*, J. Magn. Reson. 1993; A 105: 82-87; and Alderman et al., *A High Resolution High Sensitivity Isotropic and Anisotropic Correlation Experiment*, Molecular Physics 1998; 95(6): 1113-1126) and the 2D-phase-altered spinning sidebands (PASS) techniques (Antzutkin et al., *Two-Dimensional Sideband Separation in Magic-Angle-Spinning NMR*, J. Magn. Reson 1995; A115: 7-19). All of these experiments are 2D isotropic-anisotropic chemical shift correlation experiments yielding a high resolution isotropic chemical shift dimension and a chemical shift anisotropy dimension. Although MAT has been applied in solid state NMR (see Hu et al., *Magic Angle Turning and Hopping;* Gan et al., *High-Resolution Chemical Shift and Chemical Shift Anisotropy Correlation in Solids Using Slow Magic Angle Spinning*, J. Am. Chem. Soc. 1992; 114: 8307-8309; Hu et al., *Magic-Angle-Turning Experiments for Measuring Chemical-Shift-Tensor Principal Values in Powdered Solids*, J. Magn. Reson. 1995: A 113: 210-222; Hu et al., *An Isotropic Chemical Shift-Chemical Shift Anisotropy Magic Angle Slow-Spinning 2D NMR Experiment;* Alderman et al., *A High Resolution High Sensitivity Isotropic and Anisotropic Correlation Experiment;* and Antzutkin et al., *Two-Dimensional Sideband Separation in Magic-Angle-Spinning NMR*), its potential for biological research has not been explored.

One of the reasons that MAT for biological objects, as opposed to solid objects, has not been investigated is the belief that the diffusion of the molecules containing the nuclei of interest in the internal static local magnetic fields results in a time-dependent field as experienced by the nuclei. This effect worsens if the spinning frequency is reduced, resulting in imperfect suppression of the SSBs. In other words, it was expected that MAT techniques could not be employed in biological materials because the Brownian motions, which cause metabolites to diffuse throughout the cells, would make it impossible to remove the susceptibility broadening with slow MAS. Indeed, it was shown that in a standard fast MAS experiment of water embedded in glass beads the spectral lines become broad even at spinning speeds of several hundred Hz (see Leu et al, *Amplitude Modulation and Relaxation Due to Diffusion in NMR Experiments With a Rotating Sample*, Chem. Phys. Lett. 2000; 332:344-350), and that a sideband-suppression technique called total suppression of sidebands (TOSS) was ineffective for suppressing SSBs arising from water embedded in glass beads when the spinning speed was lowered to 1 kHz (see Liu et al, *Manipulation of Phase and Amplitude Modulation of Spin magnetization in Magic Angle Spinning NMR in the Presence of Molecular Diffusion*, J. Chem. Phys. 2001: 114: 5729-5734).

Another approach for increasing the sensitivity and resolution of NMR spectroscopy involves rotating the magnetic field rather than the sample. According to this approach the sample remains stationary. For example, Bradbury et al., *Nuclear Magnetic Resonance in a Rotating Magnetic Field*, Phys. Letters 1968; 26A: 405-406, disclose rotating the static magnetic field by superposing a static field and two sinusoidal fields in phase quadrature in the plane perpendicular to the static field and with amplitudes that are a factor √2 larger than that of the static component. A further development of this technique for line narrowing in bulk samples has recently reported (see Sakellariou et al., *NMR In Rotating Magnetic Fields: Magic-Angle Field Spinning*, Magn. Res. Imaging 2005: 23(2): 295-299).

SUMMARY

The present disclosure provides methods for collecting and using magnetic resonance data. In one embodiment, the method involves performing a magnetic resonance analysis of a sample. A sample is placed in a radio frequency field and a magnetic field having a static field direction. The sample or the magnetic field is rotated about a rotational axis. In particular examples, the rotational axis is at an angle of about 54°44' to the static direction. A region of the sample is selected. The radio frequency is pulsed to provide a magic angle turning pulse segment that includes at least two of a spatially selective read pulse, a spatially selective storage pulse, and a spatially selective phase pulse. Data generated by the pulsed radio frequency representative of the selected region of the sample is collected.

In some implementations, a spatially selective radio frequency pulse is applied in the presence of a magnetic field gradient applied parallel to the static field direction. Rotation of the sample subsequently aligns the three mutually orthogonal rotor axes with the magnetic field gradient, thus selecting a voxel of interest. In more particular examples, pulsing the radio frequency further includes applying one or more magnetic field gradients perpendicularly to the rotational axis, such as a magnetic field gradient during each of the read pulses, the phase pulses (which may be 180-degree pulses), or the storage pulses. Applying such gradients may reduce unwanted signals, such as signals from regions of the sample remote from the voxel of interest.

Further disclosed methods include synchronizing a magnetic field gradient with the rotation of the sample or the magnetic field so that the sample can be treated as static in the frame of the rotating magnetic field gradient. In various examples, the rotating magnetic field gradient may be applied during a read pulse, a phase pulse, or a storage pulse. The magnetic field gradient can be applied either parallel or perpendicularly to the axis of rotation. In further examples, selecting a region of the sample includes determining coordinates of the selected region and the magnetic gradient is synchronized with the rotation of the sample or the magnetic field based on the coordinates. In a specific example, selecting a region of the sample involves a first processor. The coordinates are output to a second processor, which synchronizes the magnetic gradient with the rotation of the sample or the magnetic field.

In the above-described embodiments, the rotation rate may be selected such that pulsing the radio frequency may be treated as pulsing the radio frequency of a fixed sample and a fixed magnetic field. In particular implementations, the sample is rotated at a rate of less than 100 Hz, such about 10 Hz or less. In further implementations the rotation rate of the sample is varied while a magnetic resonance analysis is being performed.

Extended imaging capabilities are provided by further embodiments of the present disclosure. Particular implementations include placing a sample in a radio frequency field and a magnetic field having a static field direction. The sample or the magnetic field is rotated about a rotational axis. In particular examples, the rotational axis is at an angle of about 54°44' with the static direction. The radio frequency is pulsed to provide a pulse sequence that includes a magic angle turning pulse segment and an extended imaging sequence. The extended imaging sequence may be, for example, a chemical shift imaging sequence or a sequence that allows a magnetic resonance analysis to be performed on a plurality of regions of the sample. For example, a chemical shift imaging sequence may include applying a frequency selective read pulse. The multiple region selection sequence, in a specific example, includes rephasing a read signal during acquisition of the read signal and varying a magnetic read gradient in order to generate a magnetic resonance analysis of the plurality of regions of the sample.

In another embodiment, the method involves performing a magnetic resonance analysis of a sample. A sample is paced in a radio frequency field and a magnetic field having a static field direction. The sample or the magnetic filed is rotated about a rotational axis. In particular examples, the rotational axis is at an angle of about 54°44" to the static direction. A region of the sample is selected. The radio frequency is pulsed to provide a magic angle turning pulse segment that includes three read pulses spaced at one-third of the rotor period of the sample rotation, three 180-degree pulses for forming an echo and three projection pulses. One or more of these RF pulses may be spatially selective. In a particular implementation, all of the RF pulses are spatially selective. Data generated by the pulsed radio frequency representative of the selected region of the sample is collected.

The present disclosure also provides method for using magnetic resonance data. Some embodiments provide methods of diagnosing a condition or evaluating the effectiveness of a therapy using magnetic resonance data. According to a particular implementation, a sample is placed in a radio frequency field and a magnetic field having a static field direction. The sample or the magnetic field is rotated about a rotational axis. In particular examples, the rotational axis is at an angle of about 54°44' with the static direction. A region of the sample is selected. The radio frequency is pulsed to provide a magic angle turning pulse segment that includes a spatially selective read pulse. The anisotropic susceptibility broadening for a species present in the selected region is determined. A condition is diagnosed, or a therapy evaluated, based on the determined anisotropic susceptibility broadening.

BRIEF DESCRIPTION OF THE DRAWINGS

Certain embodiments will be described in more detail with reference to the following drawings.

DETAILED DESCRIPTION OF SEVERAL EMBODIMENTS

I. Abbreviations

CHESS—chemical shift selective

Figure 1:
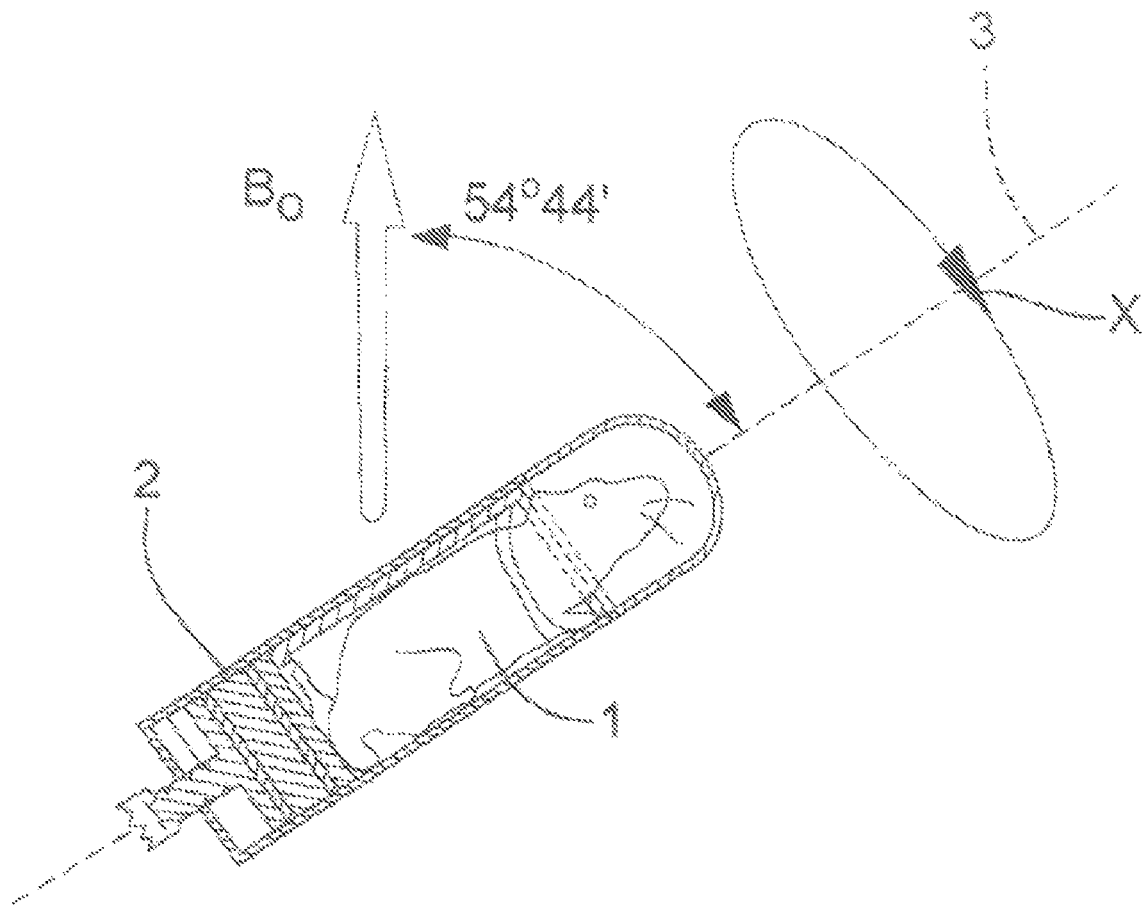
FIG. 1 is a perspective view of rotating a biological object at the magic angle relative to the main static magnetic field.

DANTE—delays alternating with nutations for tailored excitation

EPI—echo-planar imaging

FIREMAT—five π replicated magic angle turning

LOCMAT—localized phase-corrected magic angle turning

MA—magic angle

MAH—magic angle hopping

MAT—magic angle turning

MR—magnetic resonance

MRI—magnetic resonance imaging

MRS—magnetic resonance spectroscopy

NMR—nuclear magnetic resonance

PASS—2D-phase-altered spinning sidebands

PFG—pulsed field gradient

PHORMAT—phase-corrected magic angle turning

PRESS—point-resolved spectroscopy

RF—radio frequency

SNR—signal to noise ratio

SSB—spinning sidebands

STEAM—stimulated echo acquisition

TTL—transistor-to-logic

VOI—voxel (volume) of interest

WET—water suppression enhanced through $T_1$ effects

II. Terms

Unless otherwise explained, all technical and scientific terms used herein have the same meaning as commonly understood by one of ordinary skill in the art to which this invention belongs. In the case of conflict, terms have the meanings provided in the present disclosure. In order to facilitate an understanding of the embodiments presented, the following explanations are provided.

The singular terms "a," "an," and "the" include plural referents unless context clearly indicates otherwise. Similarly, the word "or" is intended to include "and" unless the context clearly indicates otherwise. The term "comprises" means "includes."

"Object" means a three-dimensional object such as an intact animal, an animal organ, a solid object such as an archaeological artifact, a spectrographic sample such as a tissue or cellular slice, a liquid non-biological material such as an organic compound or a solid material such as an organic powder sample.

"Fluid object" means an object that includes a substantial amount of fluid (such as greater than about 60 weight %.), as opposed to a solid object. A typical example of a fluid object is an intact human or a human organ that typically includes at least about 80 weight % water.

"Biological object" means any object, usually a fluid object, that includes cellular matter. Examples of biological objects include cell systems, excised tissues and intact organs, live animals, and human patients.

"Main magnet" or "main magnetic field" denotes the magnet that generates the static magnetic field (typically referred to as $B_0$ or $H_0$) as known in the art. The main magnetic field is distinguished from the RF magnetic field used to induce excitation of the atomic nuclei or the RF magnetic gradient field used in magnetic resonance. Of course, MRS and MRI tools that could be used with the described method include a main magnet capable of producing the static and homogeneous main magnetic field. Such magnets are well known and typically are superconducting magnets.

"Water suppression" refers to techniques used to reduce or eliminate signals due to water in a magnetic resonance analysis or other presentation of magnetic resonance data. For example, RF pulse sequences can be used in a water suppression segment that suppresses SSBs caused by water in a biological object. The water suppression pulse sequence may be used for analysis of metabolite spectra. Without water suppression these metabolite spectra may be polluted by artificial lines arising from SSBs of the water. Of course, water suppression need not be employed such as when it is desired to investigate the water peak or signal of a biological object.

An exemplary water suppression segment is a DANTE pulse sequence as described, for example, in Morris et al., *Selective Excitation in Fourier Transform Nuclear Magnetic Resonance*, J. Magn. Reson., 1978; 29:433-462. Another possible water suppression sequence is the known combination of a shaped pulse segment and a pulsed field gradient segment as described in Chen et al., *Biochemical Analysis Using High-Resolution Magic Angle Spinning NMR Spectroscopy Distinguishes Lipoma-like Well-differentiated Liposarcoma from Normal Fat*, J. Am. Chem. Soc. 2001; 123:9200-9201.

Alternative methods for water suppression employing pulsed field gradients can be used that significantly shorten the τ values (see Chen et al., *Biochemical Analysis Using High-Resolution Magic Angle Spinning NMR Spectroscopy Distinguishes Lipoma-like Well-differentiated Liposarcoma from Normal Fat*, J. Am. Chem. Soc. 2001; 123:9200-9201) so that a higher spinning rate can be achieved with a some disclosed RF sequences.

The above definitions are provided solely to aid the reader, and should not be construed to have a scope less than that understood by a person of ordinary skill in the art or as limiting the scope of the appended claims.

III. Overview

Disclosed methods of obtaining magnetic resonance data employ magic angle spinning. Magic angle spinning is based on exposing the object to a partially time-dependent external magnetic field rather than the static magnetic field $B_o$ currently used. Specifically, the magnetic field consists of a static component with amplitude $B_o/\sqrt{3}$, and a component of amplitude $B_o mt;epmrl;\sqrt{2/3} rlxmx$, rotating in a plane perpendicular to the static field component.

In some implementations, the slow magic angle spinning involves spinning or rotating the object at a frequency of less than about 100 Hz, preferably less than about 10 Hz, and more preferably less than about 3 Hz. An example of a range of possible rotating frequencies is about 1 to about 100 Hz, preferably about 1 to about 5 Hz. In contrast, standard fast magic angle spinning employs frequencies on the order of at least one kHz.

In further implementations, the object is "hopped" over angles of 120° (e.g., 0-120 degrees, 120-240 degrees and 240-0 degrees, or 0-120 degrees, 120-240 degrees and 240-360 degrees) around the magic axis rather than continuously rotated. The time to complete one full rotation corresponds to the rotation times when spinning continuously at a frequency of less than about 100 Hz, preferably less than about 10 Hz, and more preferably less than about 3 Hz. The RF frequency may be pulsed to produce a high-resolution spectrum that is substantially free of line broadening caused by the bulk magnetic susceptibility and the residual chemical shift interaction. Illustrative MAH techniques and the accompanying RF pulse sequences are described, for example, in Bax et al., *Correlation of Isotropic Shifts and Chemical Shift Anisotropies by Two-Dimensional Fourier-Transform Magic-Angle Hopping NMR Spectroscopy*, J. Magn. Reson. 1983; 52: 147; Hu et al., *Improving the Magic Angle Hopping Experiment*, Solid State NMR, 2, 235-243 (1993); and Hu et al., *Magic Angle Turning and Hopping*, in Encyclopedia of Magnetic Resonance D. M. Grant, and R. K. Harris, Eds. New York: John Wiley & Sons: 1996, 2914-2921. A water suppression RF pulse sequence as described above could also be used in connection with MAH techniques.

In yet further implementations, both the magnet and the biological object remain stationary, and part of the magnetic field is rendered electronically time dependent such that the overall magnetic field is rotated around the magic axis with respect to the direction of the overall magnetic field at a frequency of less than about 100 Hz, preferably less than about 10 Hz, and more preferably less than about 3 Hz. An example of a range of possible rotating frequencies is about 1 to about 100 Hz, preferably about 1 to about 5 Hz.

A suitable rotating magnetic field may be generated as the superposition of a static field and two orthogonal sinusoidal fields in phase quadrature in the plane perpendicular to the static field. The sinusoidal fields have amplitudes that are a factor $2^{1/2}$ larger than that of the static component. In particular, three RF coil configurations are used to produce magnetic fields in three mutually perpendicular directions. Applying a stationary current to one of the coils and quadrature sinusoidal AC currents to the other two coils electronically generates a rotating magnetic field. A magnetic field component is generated that is rotated in a plane perpendicular to the direction the static field component and with an amplitude that is $2^{1/2}$ times the amplitude of the static field component. The resulting overall magnetic field rotates at a frequency of about 1 to about 100 Hz, preferably about 1 to about 10 Hz, with the angle between the static field direction and the direction of the overall rotating magnetic field being about 54°44'. In other words, a magnetic field is created that rotates relative to a stationary object. Furthermore, by making the amplitude of the sinusoidal fields $2^{1/2}$ times larger than the stationary or static field, the resulting magnetic field rotates at the required magic angle.

In additional implementations, the biological object remains stationary, and the magnet is physically rotated around the magic angle with respect to the direction of the main magnetic field at a frequency of less than about 100 Hz, preferably less than about 10 Hz, and more preferably less than about 3 Hz. An example of a range of possible rotating frequencies is about 1 to about 100 Hz, preferably about 1 to about 5 Hz.

In some implementations, both the biological object and the magnetic field are rotated in opposite directions, each at a frequency of less than about 50 Hz, preferably less than about 3 Hz, and more preferably less than about 2 Hz. An example of a range of possible rotating frequencies is about 0.5 to about 50 Hz, preferably about 0.5 to about 2 Hz.

An example of a configuration for rotating the object while the main static magnetic field is stationary is shown in FIG. 1. A biological object 1 is placed in a sample holder 2 that is rotatable about an axis 3 in a direction X placed in a static magnetic field generated by a main magnet (not shown) in a MRS or MRI tool. Axis 3 is located at an angle of 54°44' relative to the direction of the static magnetic field $B_0$. MRS (e.g., NMR) and MRI apparatus capable of rotating an object or sample for MAS are well known (see e.g., U.S. Pat. No. 4,511,841). Commercially available NMR tools that have rotors for spinning a sample include those probes available from Varian/Chemagnetics, Inc. (Ft. Collins, Colo.) or Bruker Instruments, Inc. (Billerica, Mass.).

Figure 2:
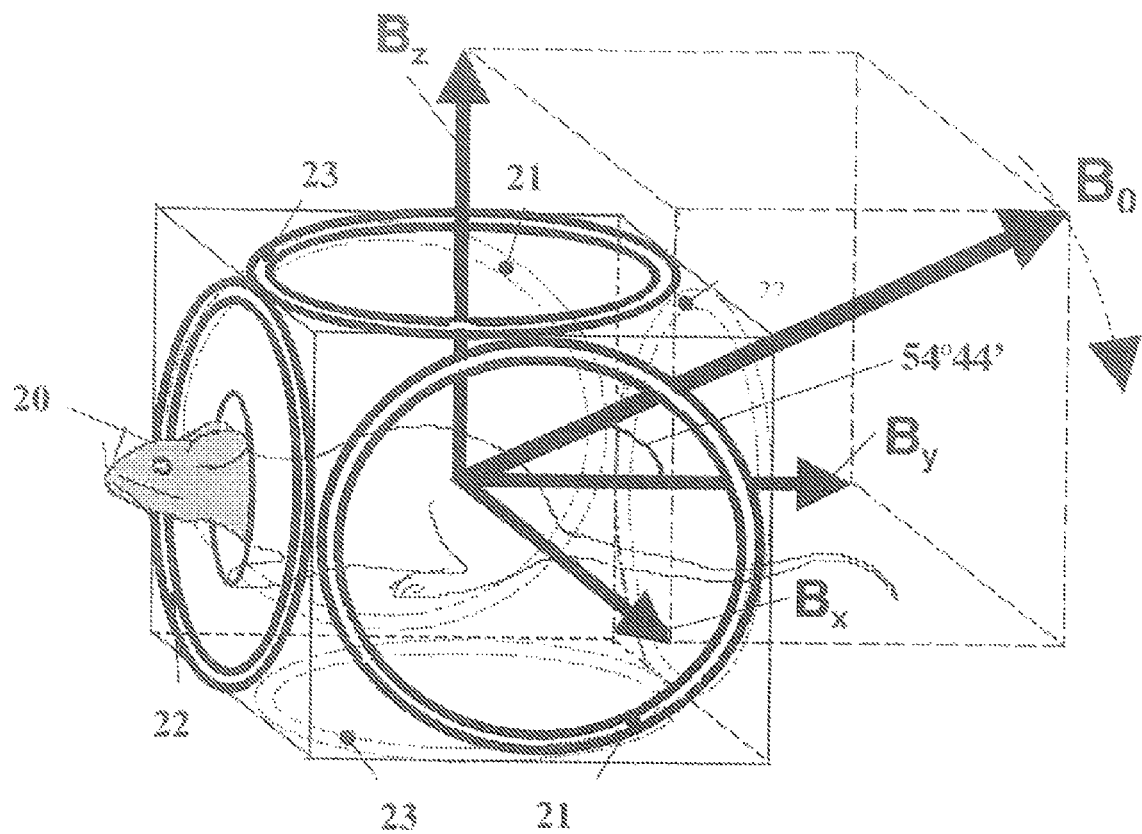
FIG. 2 is a schematic representation of a RF coil configuration for electronically rotating the magnetic field.

An example of a magnet configuration for electronically rotating the magnetic field while the biological object is held stationary is shown in FIG. 2. A complementary pair of first RF coils 21 are arranged to generate an alternating magnetic field $B_x$ in the x-direction, given by $B_x = \sqrt{2/3} \cdot B_0 \cdot \sin(\omega_r t)$. A complementary pair of second RF coils 22 are arranged to generate a static magnetic field $B_y$ in the y-direction, given by $B_y = B_0/\sqrt{3}$. A complementary pair of third RF coils 23 are arranged to generate an alternating magnetic field $B_z=\sqrt{2/3} \cdot B_0 \cdot \cos(\omega_r t)$. DC and AC currents passing through each set of coils 21, 22, 23 produce three mutually orthogonal magnetic field components. A biological object 20 is placed in the center of the coil system. As a result, the overall magnetic field is given by $B_0$, which rotates around an axis making the magic angle of 54°44' relative to the static component $B_y$.

Figure 3:
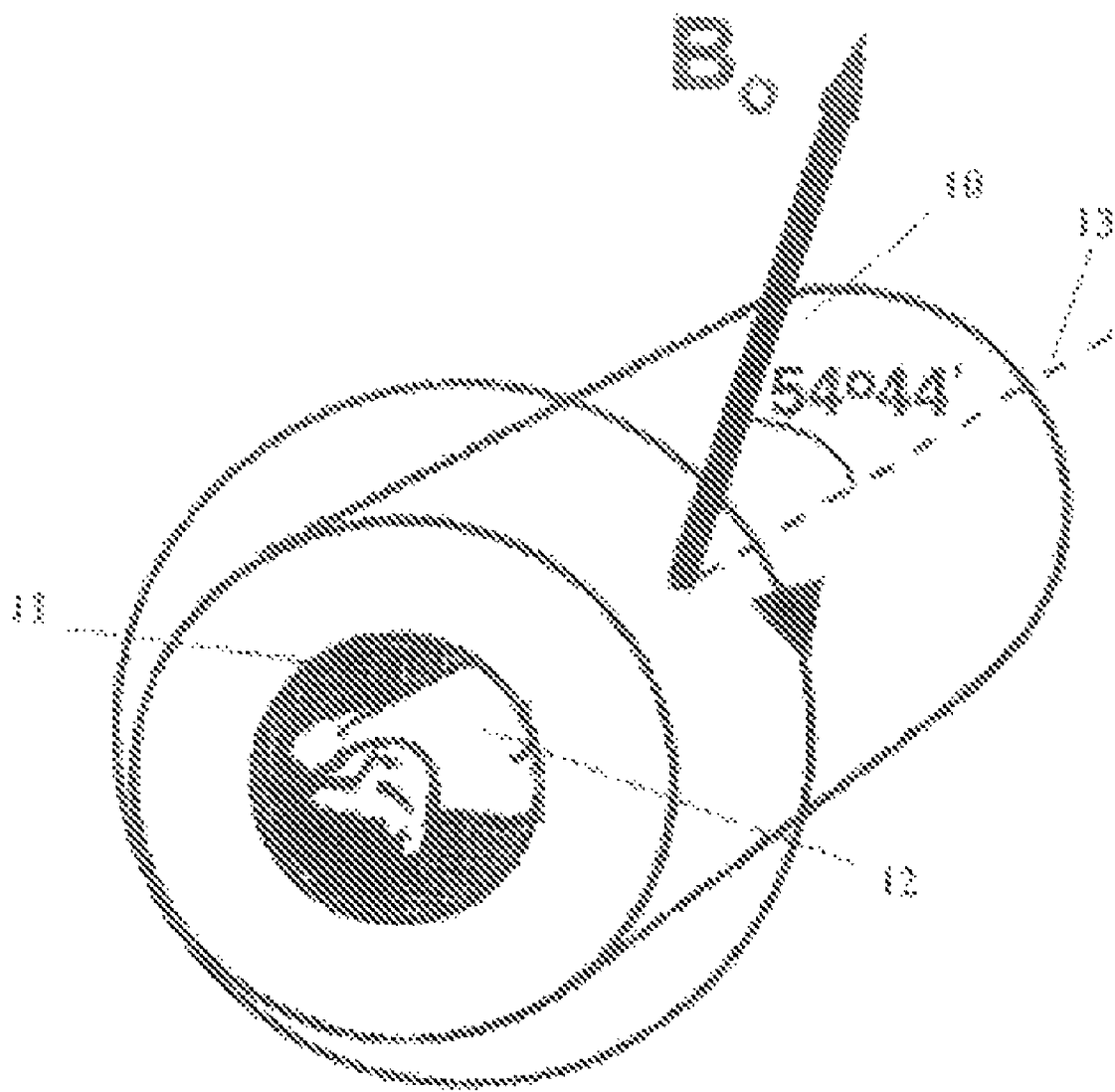
FIG. 3 is a schematic representation of a device that holds the biological object stationary and mechanically rotates the magnetic field.

An example of a configuration for physically rotating the magnet while the biological object is held stationary is shown in FIG. 3. A magnet bore 10 defines a void 11 for receiving a biological object (e.g., a human) 12 and a longitudinal axis 13. The longitudinal axis 13 of the magnet bore 10 is aligned at the magic angle of 54°44' relative to the direction of the main magnetic field $B_0$. The main magnetic field $B_0$ is generated by the magnet bore 10. The magnet bore 10 may be rotated mechanically around the longitudinal axis 13 as shown by the directional arrow in FIG. 3.

Some of the embodiments described herein involve rotating both the biological object and the main magnetic field in respectively opposite rotational directions. In such examples, the device depicted in FIG. 2 or FIG. 3 can be modified so that the biological object also rotates. Such rotation allows for the rotational frequency of both the biological object and the main magnetic field to decrease by a factor of two.

The RF radiation used in the pulse sequence of the presently disclosed methods can be generated by RF coils in a MR apparatus as known in the art. The RF pulse sequencing may be generated by techniques known in the art. For example, most modern NMR and MRI spectrometers have pulse programmers and amplifiers that are capable of producing the sequences.

The data for generating a spectrographic analysis based on the disclosed method can be collected by the same coil used for generating the RF radiation, or by a separate receiver coil. A graphical representation of the collected data may be generated by techniques known in the art such as, for example, software programs available on most modern NMR and MRI spectrometers.

Magic Angle Turning

RF pulse sequences employed in the presently disclosed methods may include a sequence or series of sequences capable of producing a high-resolution spectrum in a slow MAS approach that is substantially free of spinning sidebands. The RF pulse sequences can be repeated during every rotor period (i.e., one 360° rotation of the object) throughout the duration of the scanning. A typical characteristic of these RF pulse sequences may be isotropic-anisotropic chemical shift correlation pulse sequences. Exemplary RF pulse sequences include MAT sequences. These RF pulse sequences preferably can be applied synchronously with the spinning of the object. A combination of RF pulse sequences that each have a different function may be used.

One example of a MAT technique that could be used in the disclosed methods involves continuously rotating the biological object and applying five RF π pulses during a constant evolution time period (e.g., one rotor period). A π pulse rotates the magnetization over 180°.

Figure 4:
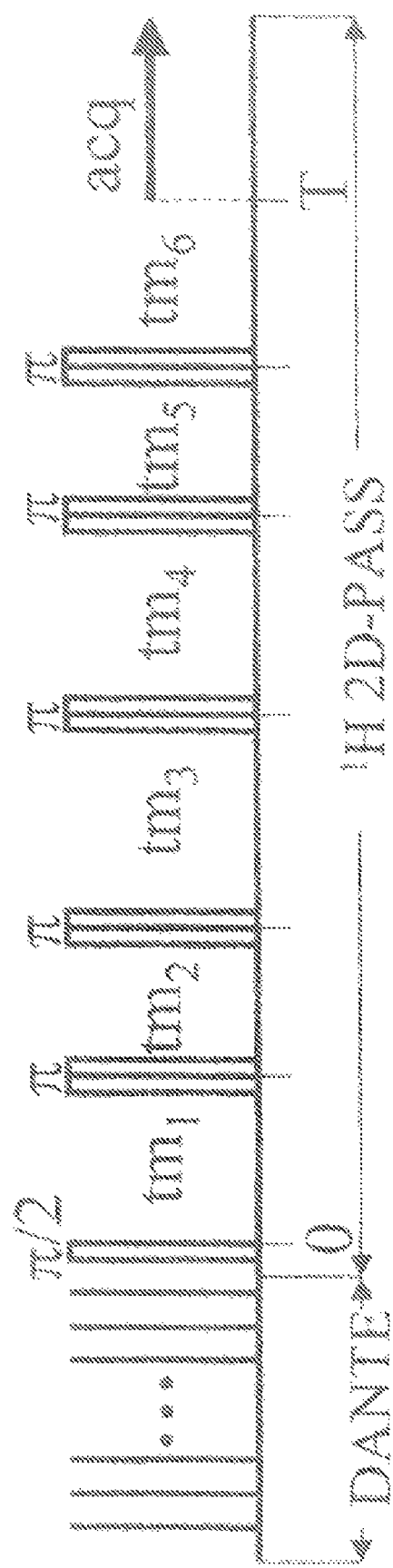
FIG. 4 represents one embodiment of a 2D-PASS RF pulse sequence in accordance with the presently disclosed methods.

An illustrative five RF π pulses technique is the five π replicated magic angle turning (FIREMAT) as described, for example, in Hu et al., *An Isotropic Chemical Shift-Chemical Shift Anisotropy Magic Angle Slow-Spinning 2D NMR Experiment*, J. Magn. Reson. 1993; A 105: 82-87; and Alderman et al., *A High Resolution High Sensitivity Isotropic and Anisotropic Correlation Experiment*, Molecular Physics 1998; 95(6): 1113-1126. Another illustrative five RF π pulses technique is the 2D-phase-altered spinning sidebands (PASS) technique as described, for example, in Antzutkin et al., *Two-Dimensional Sideband Separation in Magic-Angle-Spinning NMR,*. J. Magn. Reson 1995; A115: 7-19). One variant of a 2D-PASS segment is shown in FIG. 4. All of these experiments are 2D isotropic-anisotropic chemical shift correlation experiments yielding a high resolution isotropic chemical shift dimension and a chemical shift anisotropy dimension.

A further example of a particularly useful MAT technique is known as phase-corrected magic angle turning (PHORMAT) as described, for example, in Hu et al., *Magic-Angle-Turning Experiments for Measuring Chemical-Shift-Tensor Principal Values in Powdered Solids*, J. Magn. Reson. 1995: A 113: 210-222 and Hu et al., *Magic Angle Turning and Hopping*, in Encyclopedia of Magnetic Resonance, D. M. Grant and R. K. Harris, Eds. New York: John Wiley & Sons: 1996, 2914-2921. Similar to 2D-PASS, PHORMAT involves continuously rotating the object with RF pulses spaced at one-third of the rotor period in order to obtain an isotropic shift evolution. According to the PHORMAT technique, echo pulses are incorporated into the pulse sequence in such a way that the magnetization refocuses exactly, despite the modulation of the chemical shift by the rotation of the sample. In particular, two pulse sequences are employed that are derived from a combination of mixed-amplitude-phase-modulated and triple-echo sequences. These sequences have the effect of converting phase modulation to amplitude modulation, creating the equivalent of positive and negative evolution times by placing the 180° echo pulses either before or after the three phase-accumulating periods.

With either PASS or PHORMAT the isotropic peak can be separated from the SSB's at all spinning speeds, and the linewidth is substantially narrowed even at a spinning speed as low as about 1 Hz.

In PASS the magnetization is constantly present in the transverse plane, and the first signal is observed after one rotor period. The amplitude of the signal may be reduced as a result of the decay of the magnetization during this period, which is governed by the spin-spin relaxation time $T_2$. Therefore, signal attenuation may occur when the spinning rate is comparable to or less than $(T_2)^{-1}$.

In PHORMAT the magnetization is stored longitudinally along the main field direction with a maximum duration of $2/3$ times the rotor period. Consequently, the spinning frequency has to be large compared with the spin-lattice relaxation rate $(T_1)^{-1}$ of the spins in order to avoid signal attenuation. Lower MAS frequencies can be used with PHORMAT relative to PASS since $(T_1)^{-1}$ is usually an order of magnitude smaller than $(T_2)^{-1}$ in biological objects. For example, PASS is particularly useful for spinning frequencies of greater than about 10 Hz, especially at least about 20 Hz, and PHORMAT is particularly useful for spinning frequencies of less than about 10 Hz (e.g., about 1 Hz to 50 Hz). A further distinction between PHORMAT and PASS is that the measuring time of a PASS analysis can take only a few minutes, but the measuring time of a PHORMAT analysis can take up to one hour or more. Yet another distinction between PHORMAT and PASS is that in a PHORMAT experiment the NMR sensitivity is reduced by at least an inherent factor 4 relative to PASS.

Figure 5:
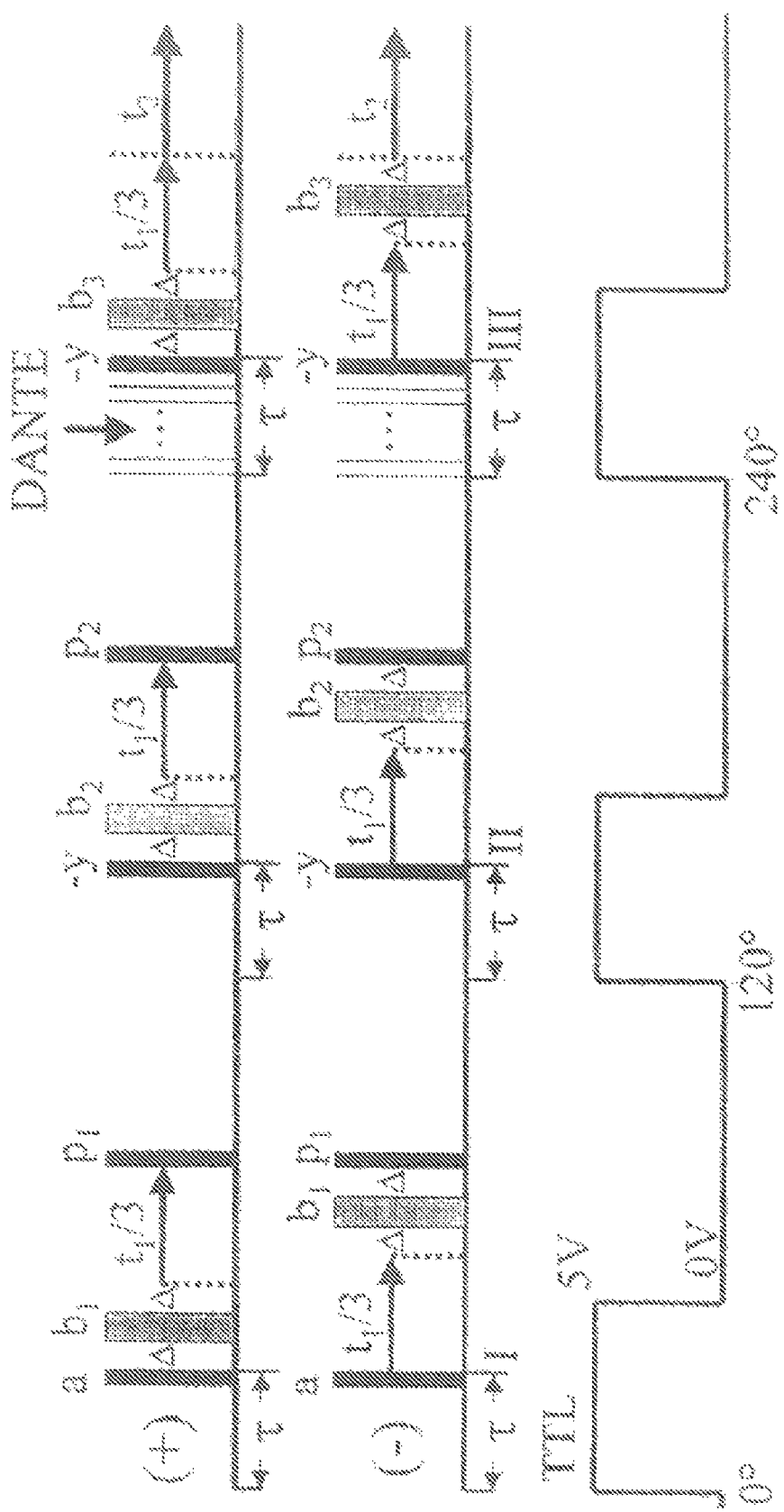
FIG. 5 represents one embodiment of a PHORMAT RF pulse sequence in accordance with the presently disclosed methods.

Certain embodiments of the present disclosure employ RF pulse sequences which are related to the modified PHORMAT sequence depicted in FIG. 5. The 90° pulses labeled (I), (II) and (III) are synchronized to $1/3$ of the rotor cycle by marking the rotor evenly with three precision marks that are mutually 120° apart. An optical detector is used to generate transistor-to-transistor logic (TTL) pulses associated with these markers, which serve as trigger pulses for the RF pulse sequences. The presence of the markers means that the spinning speed has to be stable only for a short period of time, i.e., during one rotor period. The position of the rotor with respect to the external field may differ by 0°, 120° or 240° at the beginning of each evolution increment. In the case of an anisotropic object, such rotor positioning may create distortions in the spectra as well as a loss in sensitivity. This issue can be overcome by putting a single extra marker on the rotor and using a second optical generator to generate a TTL pulse associated with this marker to trigger the beginning of a PHORMAT sequence.

A 90° pulse (I) is substituted for the cross-polarization component to rotate the magnetization in a plane perpendicular to that of $B_o$. A DANTE pulse sequence segment was employed immediately before the last pulse (III) to suppress the water signal. The DANTE pulse sequence was inserted by switching the carrier frequency to the center of the water peak prior to the start of the DANTE sequence and then switching this frequency back to its original value at the end of the DANTE segment. The first two 90° pulses (I) and (II) are delayed by the time τ of the DANTE segment applied before the third readout pulse (III). This delay is instituted to separate the three read pulses (I, II, and III) by exactly ⅓ of the rotor period.

In FIG. 5 the 90° pulses are denoted in black and the 180° pulses are denoted in gray. The phase cycling for the initial 90° pulse labeled by "a" is (−y, +y) while the phase cycles for the rest of the pulses ($p_1$, $p_2$, $b_1$, $b_2$ and $b_3$) are the same as those described in Hu et al., *Magic-Angle-Turning Experiments for Measuring Chemical-Shift-Tensor Principal Values in Powdered Solids*, J. Magn. Reson. 1995: A 113: 210-222. The parameter Δ denotes half of the echo time. The use of 180° pulses, placed before (+) of after (−) the three phase accumulation periods significantly improves the base plane of the 2D spectra and produces a spinning sideband-free isotropic spectrum directly as a projection onto the evolution axis without shearing. The time variables $t_1$ and $t_2$ correspond to the evolution and acquisition dimension, respectively. The bottom trace is the TTL signal generated by the optical sensor of the MAS probe.

Some embodiments of the present disclosure provide MRI (including localized MRS) methods that may be enhanced by using localized slow magic angle turning techniques disclosed herein. In this instance, the biological object is also subjected to pulsed magnetic fields that can produce gradients in the main magnetic field in the X, Y, and Z directions. These methods provide the ability of obtaining nuclear magnetic resonance data concerning a specific predetermined region or space (such as a voxel) of the biological object rather than the whole object.

In disclosed methods directed to obtaining magnetic resonance data from a slice or voxel of interest, signals from outside the region of interest are typically reduced by applying gradients to select signals from the region of interest. In further embodiments, signals from outside the region of interest can be saturated with RF radiation. In particular implementations, saturation outside the region of interest is employed in conjunction with spatially selective pulses and magnetic gradients.

One example of combining MAT with MRI involves applying a MAT sequence as described above to a biological object rotating around the magic axis to obtain a NMR spectrum by generating magnetic field gradients rotating synchronously with the object and preceding the MAT sequence with volume selective RF and gradient pulses such as point resolved surface spectroscopy (PRESS) (see Bryant et al., *Spatial Localization Techniques for Human MRS*, Biomedical Magnetic Resonance Imaging and Spectroscopy (Young, ed. Wiley, New York, pp. 785-791 (2000)). U.S. Pat. No. 4,301,410 describes a system and process for generating magnetic field gradients that rotate synchronously with an object. Specific illustrations of combining MRI sequences with slow MAT sequences are depicted in FIGS. 6A-6E and 7. FIGS. 6A-6E show various examples of imaging pulse sequence combined with a PASS sequence. FIGS. 7A and 7B show pulse sequences that include a PHORMAT sequence.

Figure 6A:
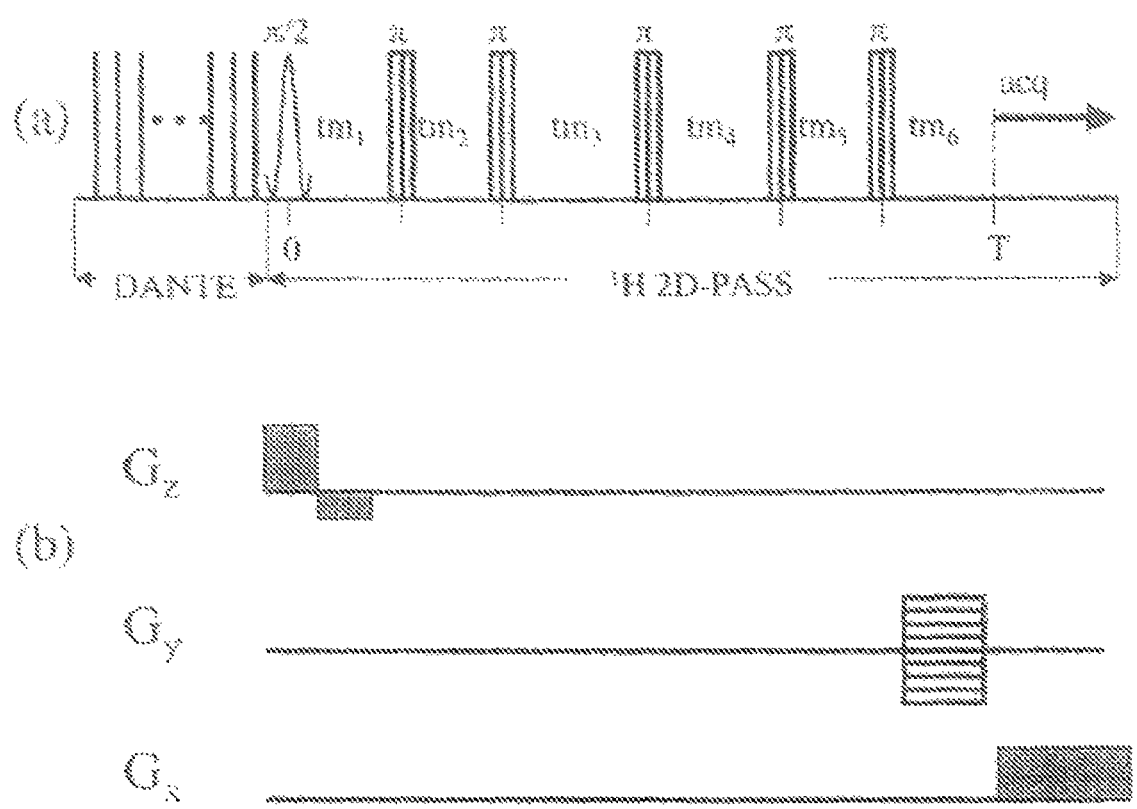
FIGS. 6A-6E schematically represent embodiments of pulse sequences that combine MRI sequences with 2D-PASS sequences.
Figure 7A:
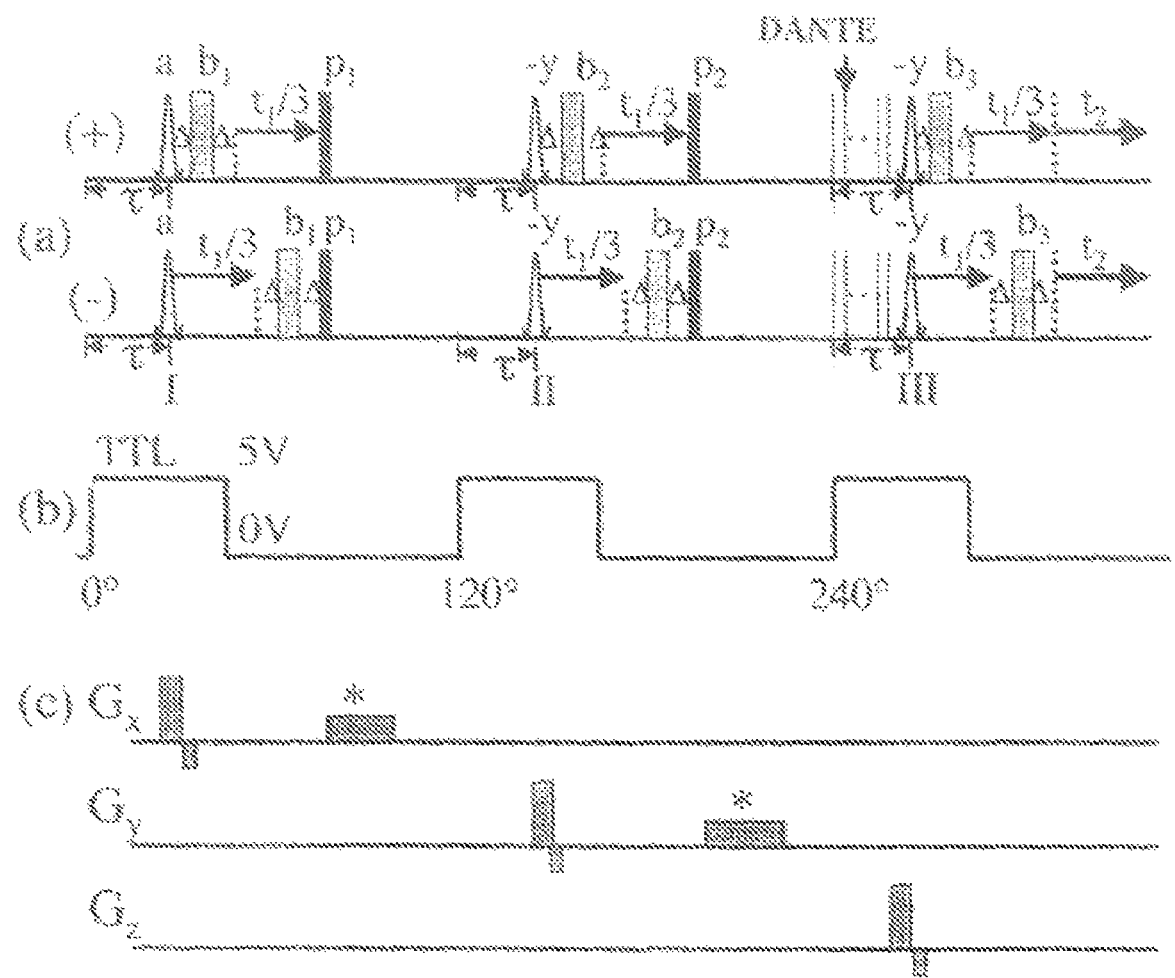
FIGS. 7A and 7B schematically represent embodiments of pulse sequences that combine MRI sequences and PHORMAT sequences.
Figure 7B:
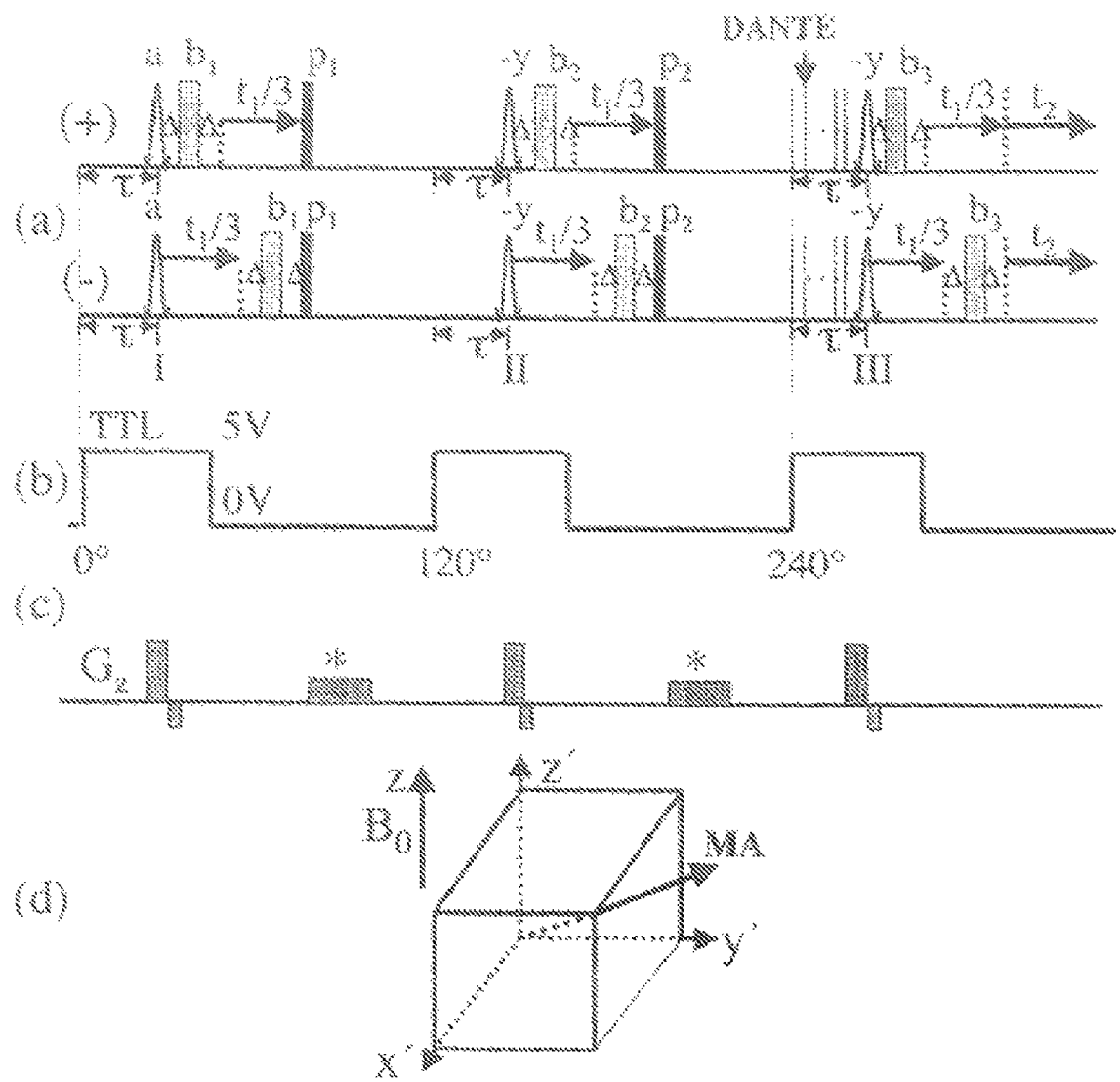

FIG. 6A shows a 2D imaging pulse sequence combined with a PASS sequence. The π/2 pulse is a sinc selective pulse applied in the presence of the gradient $G_z$. Gradients $G_x$, $G_y$ and $G_z$ are rotating synchronously with the sample rotation so that in the sample frame the gradients are static. The gradient coils themselves are not required to rotate since the rotating gradients may be obtained electronically with ac currents through the coils, similar to the way a rotating $B_o$ field is produced electronically. $G_z$ is the slice selection gradient along the rotor axis. $G_x$ is the readout gradient along the rotor x axis. Gy is the phase encoding gradient along the rotor y axis. For water suppression, a CHESS sequence (Haase et al., *$^1$H NMR Chemical Shift Selective (CHESS) Imaging*, Phys. Med. Biol. 1985; 30:341-344; Dreher et al., *Changes in Apparent Diffusion Coefficients of Metabolites in Rat Brain After Middle Cerebral Artery Occlusion Measured by Proton Magnetic Resonance Spectroscopy*, Magn. Reson. Med. 2001; 45:383-389 can be used to replace the DANTE segment.

Figure 6B:
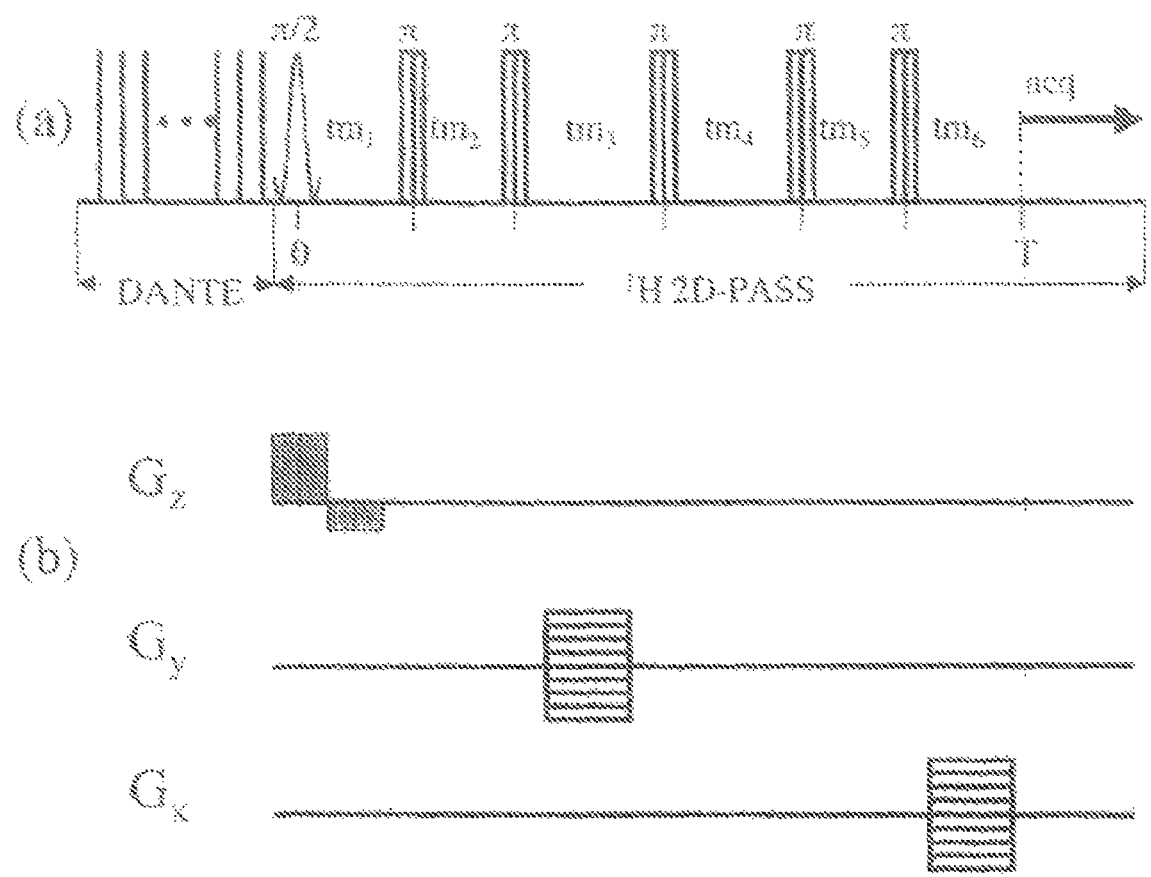

FIG. 6B depicts a 2D chemical shift imaging pulse sequence utilizing a PASS sequence. The only difference with the 2D-MRI-PASS sequence shown in FIG. 6A is that the readout gradient $G_x$ is replaced by a phase-encoding gradient in the same direction.

Figure 6C:
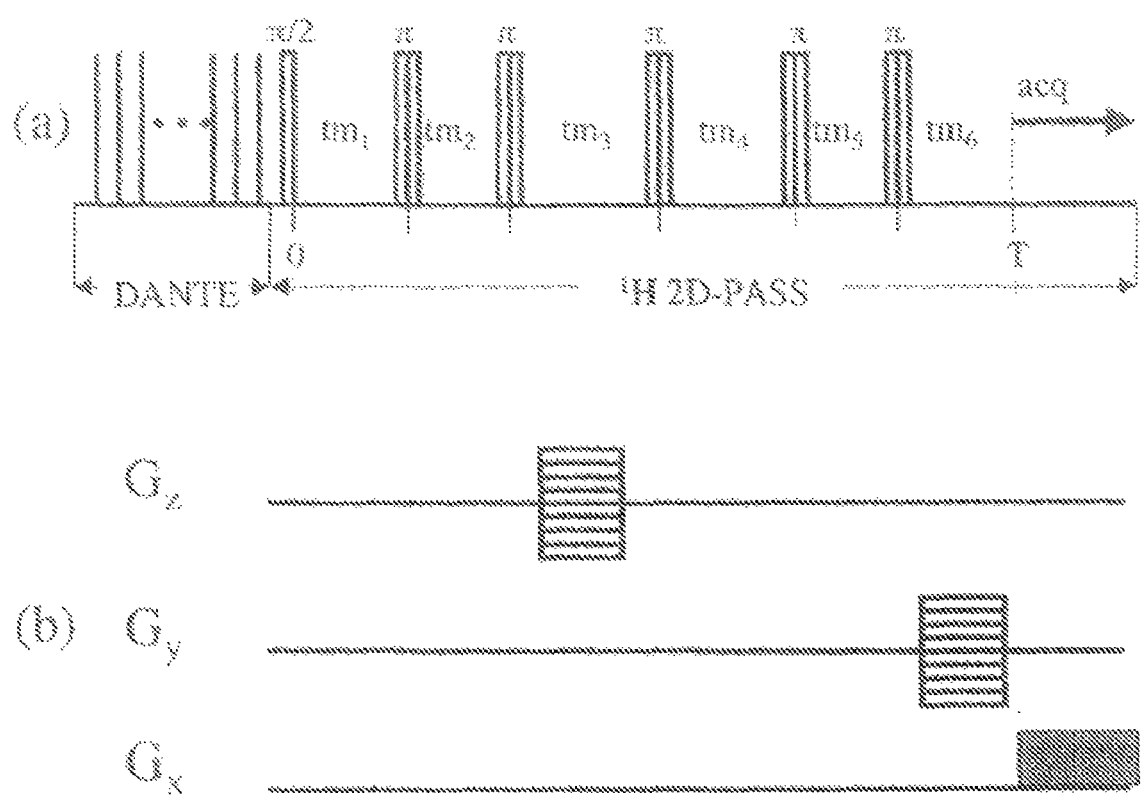

FIG. 6C shows an example of a 3D imaging pulse sequence combined with the PASS method. Gradients $G_x$, $G_y$ and $G_z$ are rotating synchronously with sample rotation so that in the sample frame the gradients are static as described above in connection with FIG. 6A. $G_z$ is the phase encoding gradient along the rotating axis, $G_y$ is the phase encoding gradient along the rotor y axis, and $G_x$ is the readout gradient along the rotor x axis. For water suppression, a CHESS sequence can be used to replace the DANTE segment.

Figure 6D:
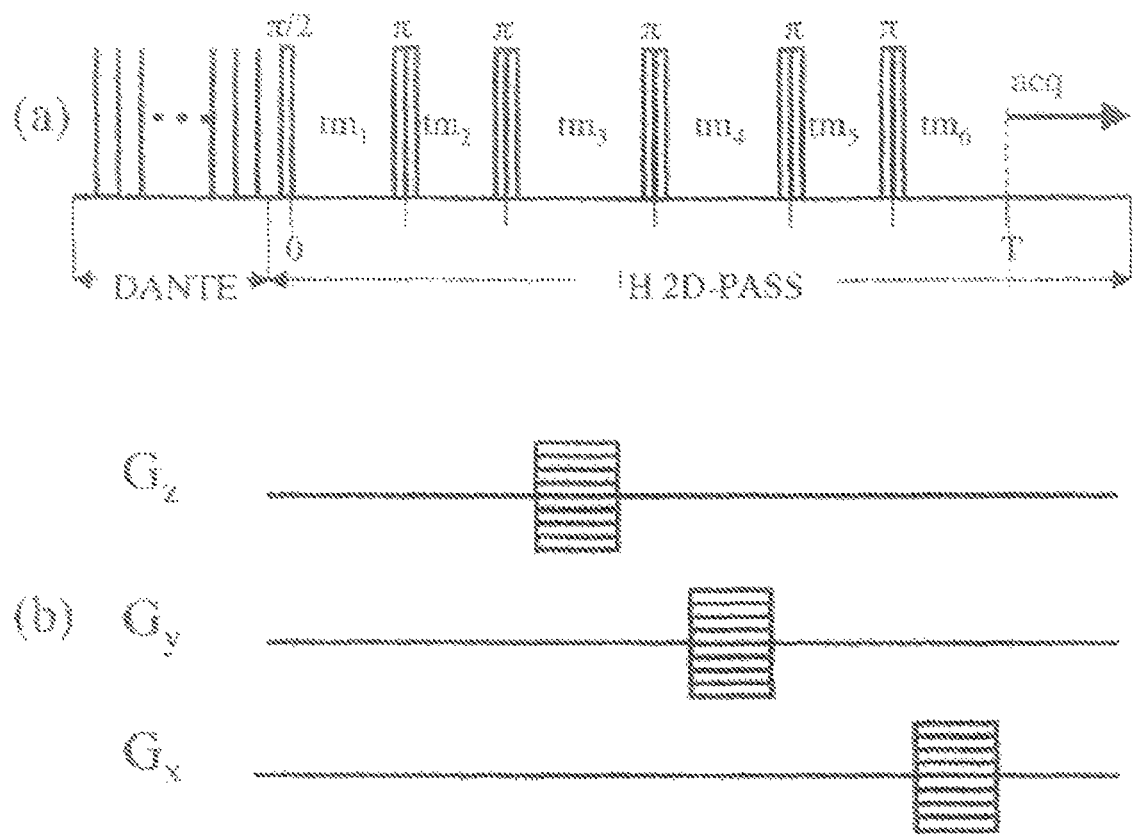

FIG. 6D illustrates a 3D chemical shift imaging pulse sequence using a PASS sequence. The only difference with the 2D-MRI-PASS sequence shown in FIG. 6C is that the readout gradient $G_x$ is replaced by a phase-encoding gradient in the same direction.

Figure 6E:
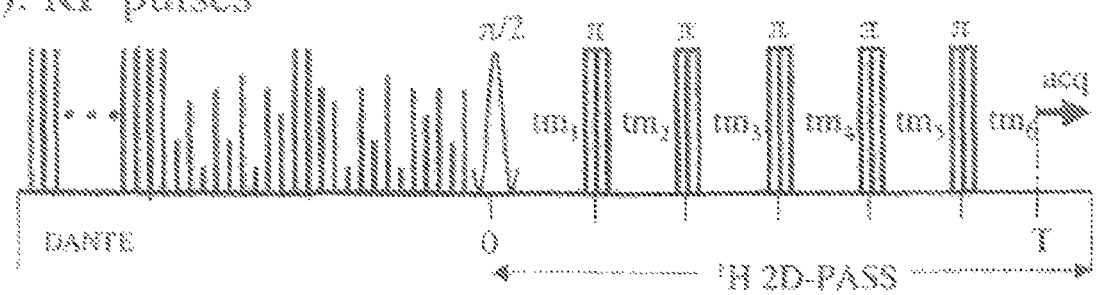
Figure 6E:
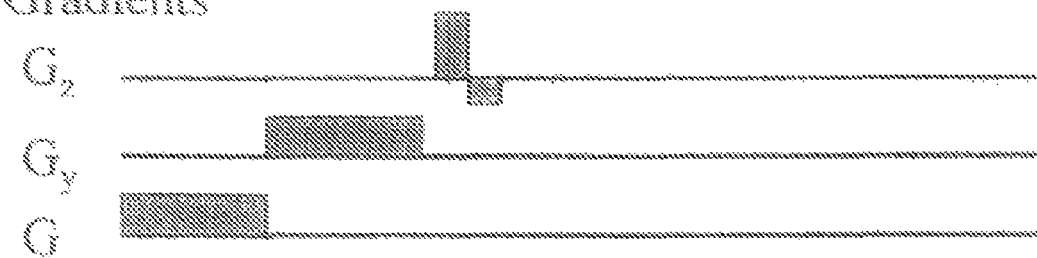
Figure 6E:
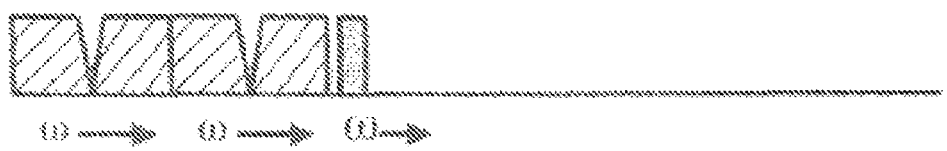

FIG. 6E shows an example of volume-selected localized magnetic resonance spectroscopy (MRS) using PASS. $G_x$, $G_y$ and $G_z$ are rotating gradients that are rotating synchronously with the sample rotation as described above in connection with FIG. 6A. After the DANTE sequence, a tailored excitation sequence (Ernst et al., Principles of Nuclear Magnetic Resonance in One and Two Dimensions, Oxford University Press Inc., New York, 1997, p. 557) is applied such that the RF spectrum is essentially white except for a dip. Simultaneously, a x-gradient is applied. As a result, the sequence provides out of voxel saturation, as all volume elements are saturated except for a slice perpendicular to the x-axis. Then the tailored excitation is repeated in the presence of a y-gradient. As a result, only a tube perpendicular to the y-axis is not saturated. Finally, a selective sinc 90° pulse is applied in the presence of a z-gradient and a volume is therefore excited. For water suppression, a CHESS sequence can be used to replace the DANTE segment. Similar suppression sequences can be employed in other disclosed methods, such as PHORMAT, including localized PHORMAT (LOCMAT) sequences.

FIG. 7A shows a LOCMAT sequence using rotating gradients. Sequence (a) is the basic PHORMAT sequence that includes the trigger (b), where the pulses located at (I, II and III) positions are sinc selective pulses in the presence of gradients (c) (analogous to the stimulated echo acquisition (STEAM) sequence, see J Frahm et al., J. Magn. Res. 72, 502 (1987)). The black pulses are non-selective 90° pulses and the shaded pulses are non-selective 180° pulses. The gradients labeled with '*' are spoil gradients used to destroy any magnetization that is left in the transverse plane after the black pulses. The (c) pulsed gradients are rotating synchronously with the object. Hence $G_x$, $G_y$, and $G_z$ are static in a reference frame rotating synchronously with the object as described above in connection with FIG. 6A. For water suppression, a CHESS sequence can be used to replace the DANTE segment.

FIG. 7B depicts a LOCMAT sequence using a static gradient. Sequence (a) is the basic PHORMAT sequence that includes the trigger (b), where the pulses located at (I, II and III) positions are sinc selective pulses applied at the presence of gradient pulses (c). The black pulses are non-selective 90° pulses and the shaded pulses are non-selective 180° pulses. Only the static z-gradient needs to be used since the three sinc pulses are located 120° around the circle of sample rotation provided that the rotation axis (MA) is along the magic angle as illustrated in (d). The gradients labeled with '*' are spoil gradients used to destroy any magnetization that is left in the transverse plane after the black pulses. For water suppression, a CHESS sequence can be used to replace the DANTE segment.

Figure 8:
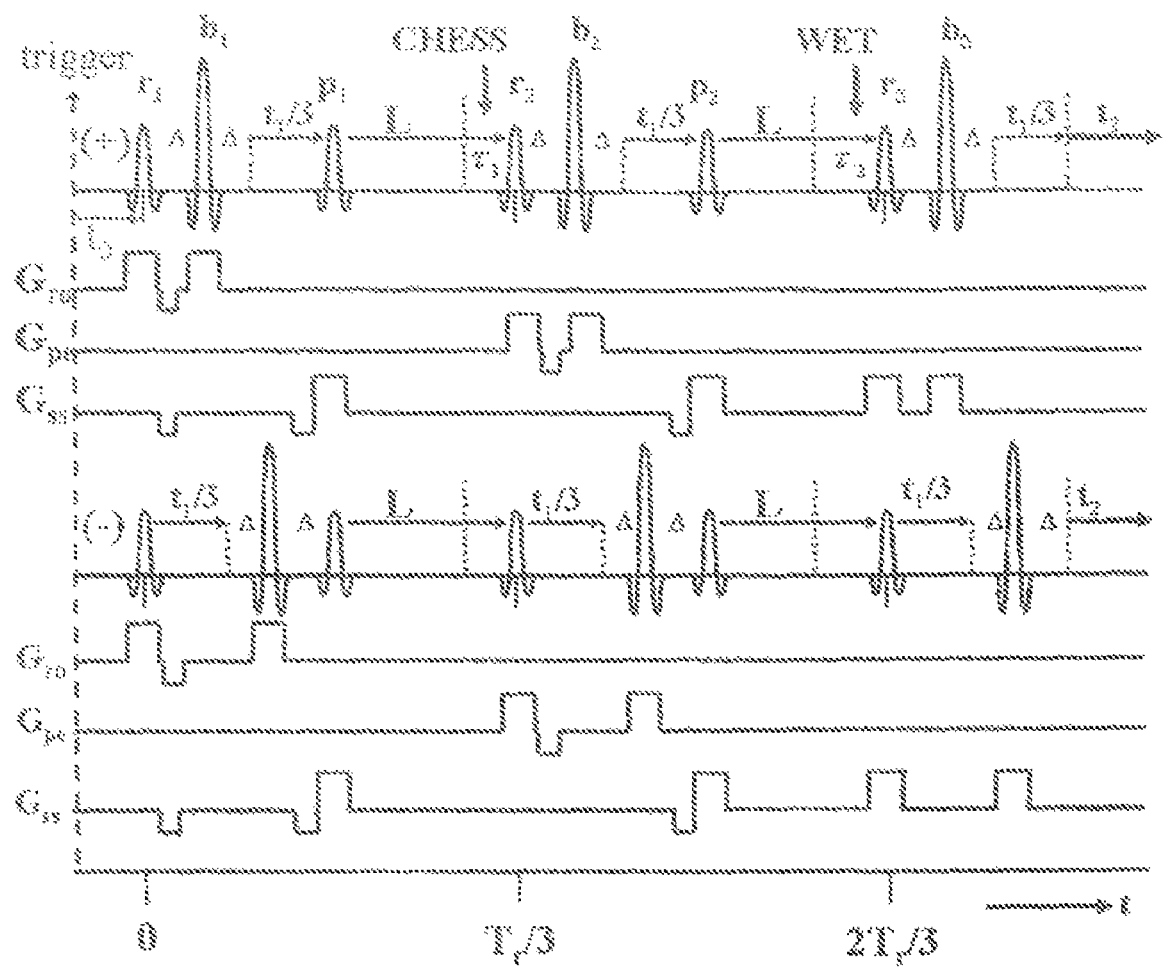
FIG. 8 schematically represents a disclosed LOCMAT RF pulse sequence that uses rotating pulsed field gradients.

Some implementations of LOCMAT employ a plurality of spatially selective RF pulses. FIG. 8 illustrates an example of a LOCMAT sequence having spatially selective sinc 90° read pulses $r_1$, $r_2$, $r_3$; 180° phasing (projection) pulses $b_1$, $b_2$, $b_3$; and 90° storage pulses $p_1$, $p_2$, $p_3$. Making pulses spatially selective can reduce $t_1$ noise. In some examples, not all pulses need be spatially selective. For example, some methods include at least two of spatially selective read, phase, and storage pulses. Furthermore, not all of a given type of pulse need be spatially selective in a particular pulse sequence. Thus, pulse sequences can include, for example, spatially selective read pulse and non-spatially selective read pulses. Such pulse sequences may be of particular interest when both isotropic and anisotropic data is of interest.

Like the sequence of FIG. 7A, the sequence of FIG. 8 includes rotating pulsed field gradients applied during the read pulses in order to isolate a particular voxel of interest. However, the FIG. 8 sequence includes additional pulsed field gradients applied during the spatially selective phase and storage pulses.

The phase, or projection, pulses are used to allow the 2-D spectrum to be phased, rather than being limited to the data being displayed in absolute-value mode. As in the PHORMAT technique, the 180° ($\pi$) pulses positioned before (+) and after (−) the three phase-accumulation periods have the effect of converting phase modulation to amplitude modulation, allowing the 2-D spectrum to be properly phased.

The pulse sequence of FIG. 8 also includes suppression sequences to reduce signals that might otherwise interfere with data of interest. For example, the pulse sequence can include chemical shift suppression or water suppression sequences. In a particular example, the sequence includes single-pulse CHESS (chemical shift suppression) and 4-pulse WET (water suppression enhanced through $T_1$ effects) water suppression sequences, as shown in FIG. 8. Crusher gradients, not shown, may be generated to destroy remaining magnetization during these periods.

Figure 9:
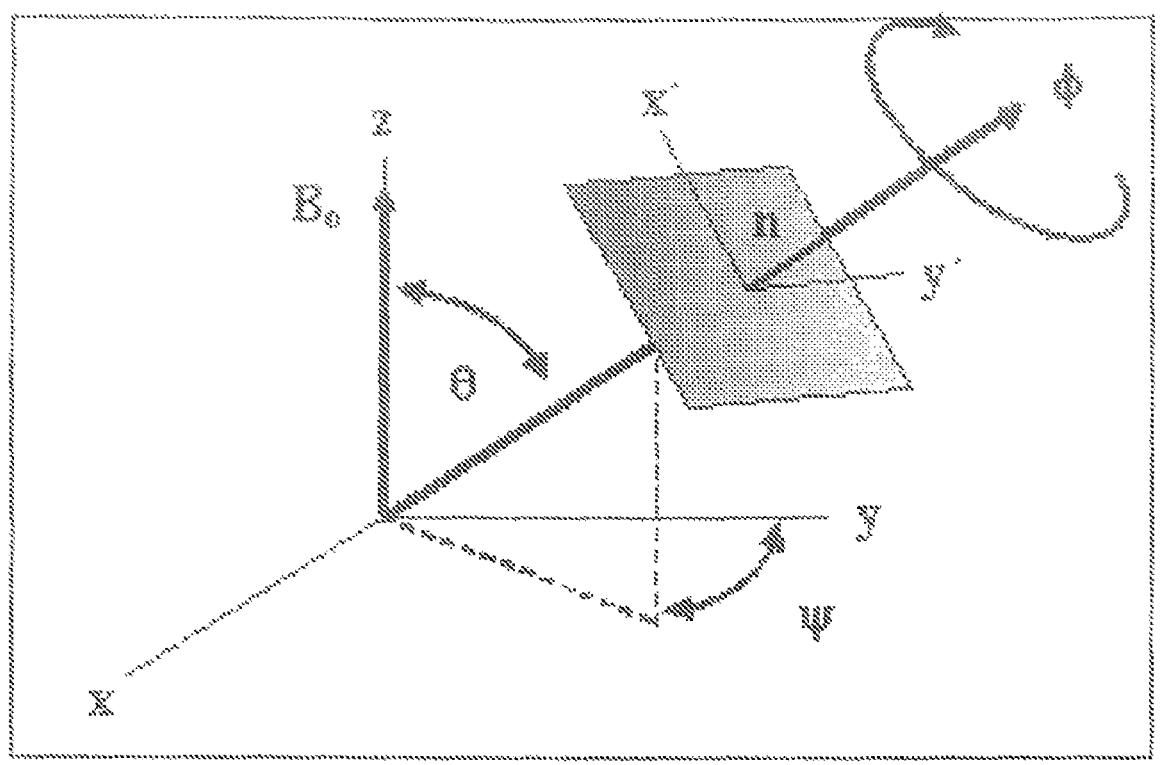
FIG. 9 is a schematic representation of laboratory frame and rotating frame axes employed in some methods of the present disclosure.

As shown in FIG. 9, both $G_{ro}$ and $G_{pe}$ are a linear combination of x' and y', where x' and y' define the axes in the rotating frame that is synchronized with sample rotation. In the rotating frame that is synchronized with sample rotation, the slice positions and the directions of $G_{ro}$ and $G_{pe}$ are constant. In order to implement the rotating pulsed field gradients in the pulse sequence, only the angle of $\phi$ need be synchronized with sample rotation. The value of $\phi$ for subsequent gradients may be calculated based on the time points of the gradients and the sample rotation speed.

In some examples the rotating gradients are implemented by synchronizing the timing of the gradient pulses with the sample rotation. In such examples magnetic gradients are applied in the laboratory frame during specific orientations of the sample.

Further examples use rotating gradients that are synchronized with the rotation of the sample and are thus appear fixed relative to the sample. A suitable rotational transformation can be used to transform coordinates from the laboratory frame to the rotating, sample-fixed, frame. The transformation employs the instantaneous sample rotor phase $\phi_r$.

Many existing instruments can implement rotating magnetic gradients because the sample appears stationary in the rotating frame. Conventional pulse sequences can thus be used on such instruments, as can resident volume planning software. However, the present disclosure provides apparatus and methods for carrying out the rotational transformations on instruments not otherwise capable of carrying out a suitable transformation.

In some embodiments, the instrument is interfaced with a transformer device that includes a processor, a memory, and a communications interface. The magnetic resonance instrument may be interfaced with the transformer using any suitable protocol, such as, for example, USB, serial, parallel, SCSI, IRDA, RS232, SPI, RJ45, wireless protocol, or PS/2 connections. The memory includes an algorithm for conducting the rotational transformation. The algorithm is processed by the processor, which may any suitably fast processor, including those used on personal computers and microcomputers, including processors available from Intel, Corp. of Santa Clara, Calif., or Sun Microsystems, Inc., of Santa Clara, Calif.

Figure 10:
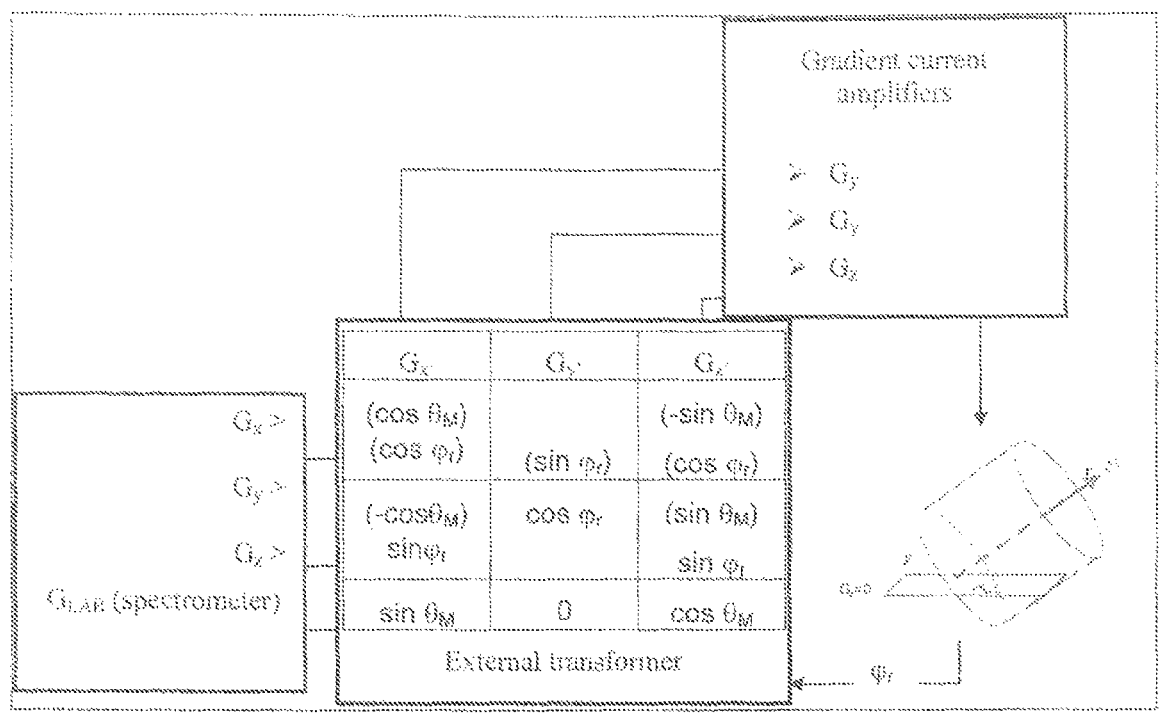
FIG. 10 is a schematic illustration of a transformer that can be used to convert laboratory frame parameters to rotating frame parameters to be input to an instrument for carrying out certain methods of the present disclosure.

As shown in FIG. 10, gradient patterns and rotor phase information is transmitted from the instrument to the transformer. The transformer transmits transformed rotating frame patterns to the current amplifiers of the instrument. In particular examples, rotor phase feedback is transmitted to the transformer instead of the instrument, which can simplify interfacing and help make the transformation insensitive to rotation rate instability. In more particular examples the transformer includes gain and offset adjustments for each gradient input or output. The transformer may include the option to bypass the transformation algorithm. FIG. 10 also illustrates a matrix that can be used to carry out the rotational transformation.

Figure 11:
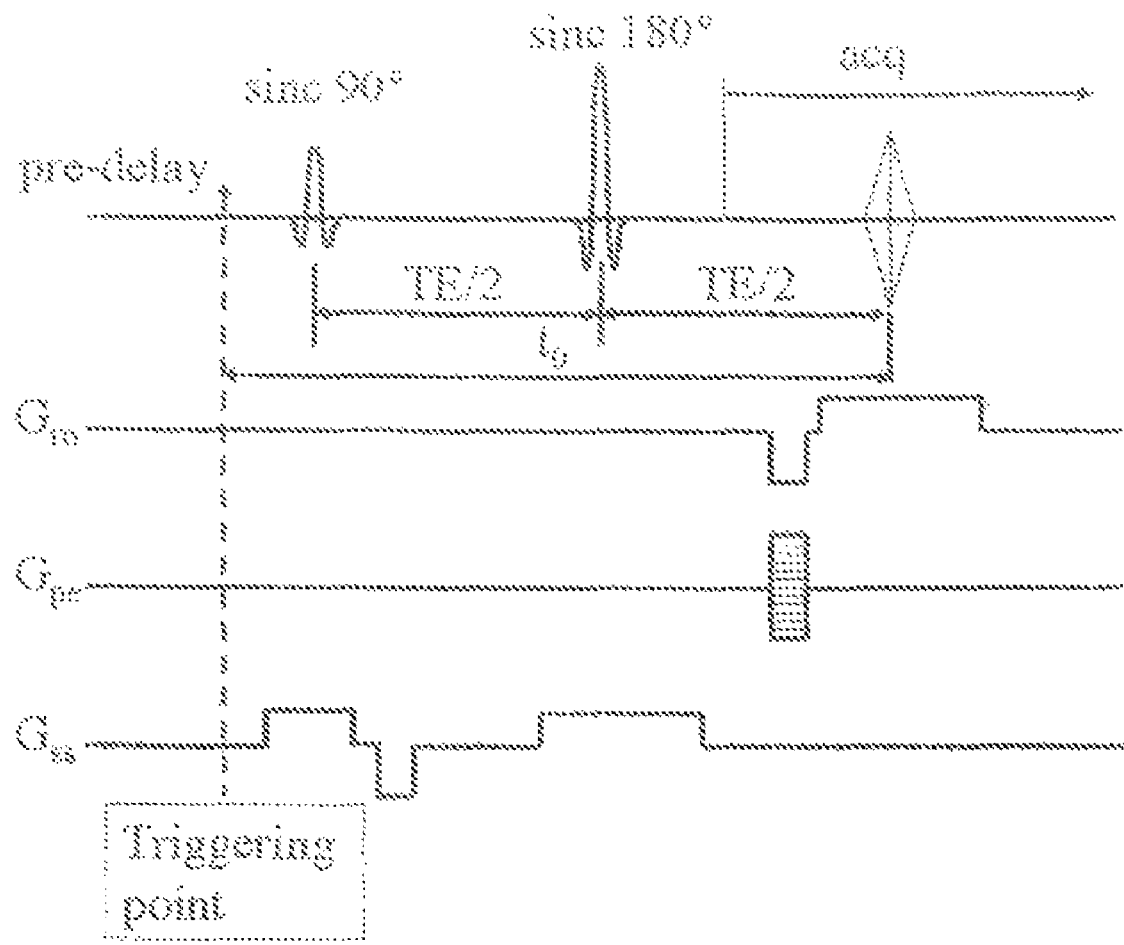
FIG. 11 is a schematic representation of a modified spin-echo imaging sequence which can be used to acquire a scout image on a rotating object for use in conjunction with the pulse sequence of FIG. 8.

In some embodiments, a scout image is used to select a voxel of interest and determine the appropriate parameters for the LOCMAT pulse sequence. FIG. 11 illustrates a modified 2D spin-echo MRI pulse sequence that can be used to acquire a scout image on a slowly rotating sample.

In FIG. 11, an imaging plan perpendicular to the axis of sample rotation is selected by the gradient $G_{ss}$, which is applied during the 90° and 180° sinc pulses. Sample rotation has no effect on $G_{ss}$. The frequency encoding gradient $G_{ro}$ and the phase encoding gradient $G_{pe}$ select mutually perpendicular slices that are also perpendicular to the slice selected by $G_{ss}$. In order to reduce motion blurring on the image, the refocusing gradient of $G_{ss}$ is applied immediately prior to the $G_{ro}$ gradient. The $G_{pe}$ gradient is applied concurrently with the $G_{ro}$ gradient. If the rotation speed is sufficiently slow, and the lengths of both $G_{ro}$ and $G_{pe}$ are sufficient short, a nearly static image can be produced.

A fixed mark, such as a black or white mark, on the sample rotor in conjunction with an optical transmittal and receiver can be used to generate a TTL signal that triggers the start of the first gradient pulse in $G_{ss}$. In FIG. 11, $t_0$ indicates the time from the trigger point to the middle of the $G_{ro}$ gradient and can be used to define the initial value of φ. The scout image also allows selection of a slice of interest and provides a value for $G_{ss}$. Conventional spectrometer planning routines can be used to determine $G_{ro}$, $G_{pe}$, and initial values of θ, and ψ for a particular voxel.

Figure 12:
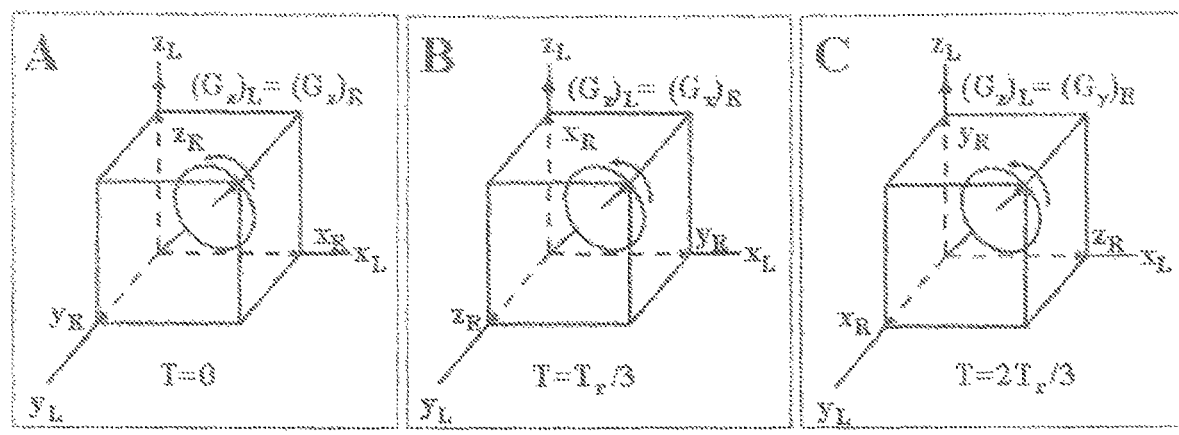
FIG. 12 is a schematic illustration of how sample rotation carries the rotating frame axes into the static z-gradient.

Further implementations of LOCMAT use a static z (laboratory frame) gradient, rather than rotating pulsed field gradients. FIG. 12 illustrates how a single z-gradient can be used to localize a voxel of interest. Rotation of the sample aligns each of the three mutually-orthogonal sample-fixed directions with the laboratory z axis ($B_0$) direction. The rotor axis defines the [1,1,1] direction of the rotor-fixed coordinates. This means that a z-gradient in the laboratory frame (($G_z)_0$), when applied at each third of a rotor period (when the excitation pulses $r_1$-$r_3$ are applied), is automatically transformed into three orthogonal gradients in the frame rotating synchronously with the rotor. Hence, using frequency-selective sinc excitation pulses allows a voxel (the black box in FIG. 13) to be selected for a rotating object in a manner similar to the selection of a voxel in a stationary object using the STEAM technique, so long as the volume's [1,1,1] axis is coincident with the rotor axis direction.

Figure 13:
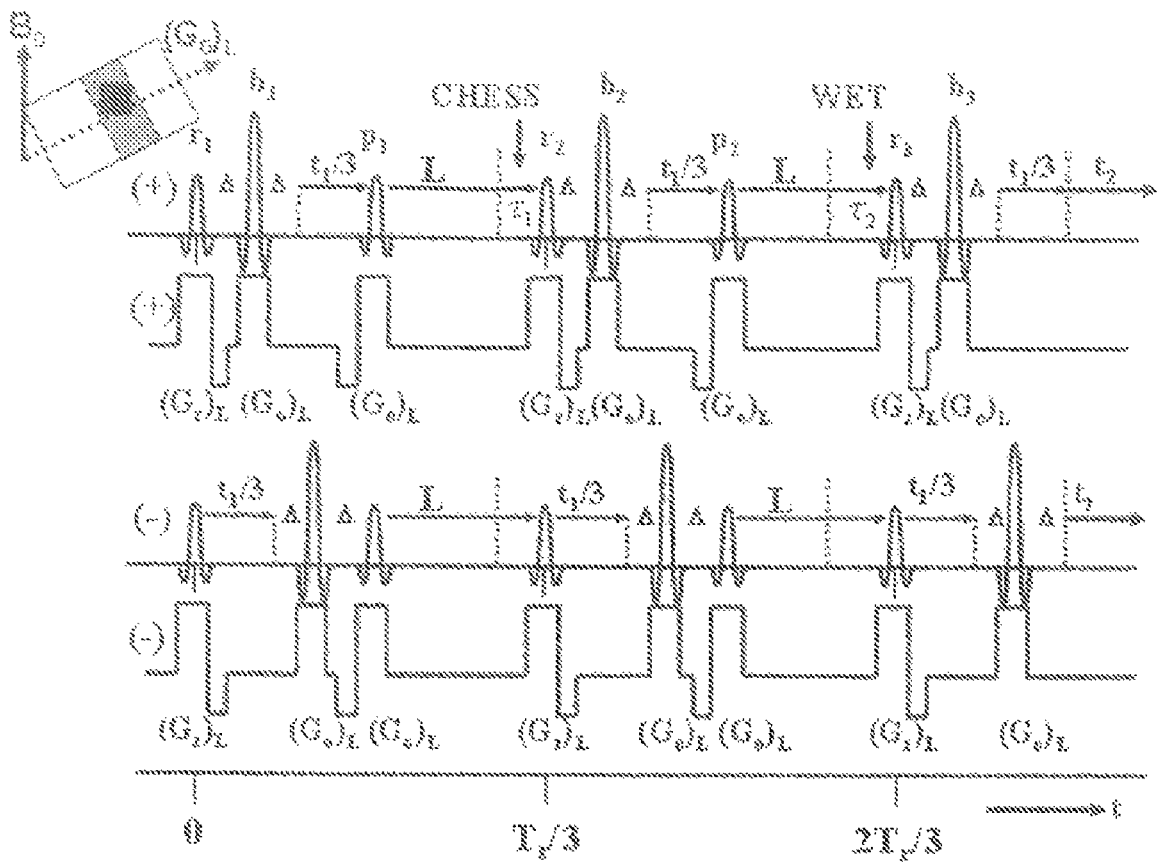
FIG. 13 is a schematic representation of a LOCMAT RF pulse sequence of the present disclosure which uses a static z-gradient to select a voxel of interest.

An example of LOCMAT sequence using a fixed z-gradient is shown in FIG. 13. The gradient pulse duration is typically selected to be short compared with the rotor period. This condition is typically satisfied in the disclosed methods as the gradient pulse is typically a few milliseconds and the rotor period is typically several hundred milliseconds.

As with the sequence of FIG. 8, the static gradient sequence of FIG. 13 employs spatially selective read, phase, and storage pulses. The phase and storage pulses are applied in the presence of an oblique laboratory frame gradient $(G_0)_L$, oriented along the rotor axis. The phase and storage pulses thus select the grey slice shown in FIG. 13, reducing signals arising from outside the voxel of interest. The slice thickness can be chosen to reduce signals coming from beyond a particular region of interest. In particular examples, the slice selected by $(G_0)_L$ is chosen to be about 1.4 times the size of the voxel selected by $(G_z)_L$, so that the boundaries of the slice are touching the corners of the voxel.

In particular implementations, carrying out a LOCMAT measurement includes first performing a one-time MRI procedure to define the rotor axis in the laboratory gradient frame. This rotor axis definition will remain valid as long as the sample (probe) is repositioned in the same location. A static volume of interest is then defined by standard means, such as acquiring MR images for the stationary sample and then using graphical voxel-of-interest planning software. Suitable software includes programs used for the PRESS and STEAM techniques.

After the voxel of interest is defined, the static coordinates are transformed into a set of dynamic, rotor-phase-synchronized laboratory x coordinates for use in the pulse-sequence input. These spatially selective excitation input parameters are analogous to the static PRESS and STEAM methods. While the voxel-of-interest will be centered at the same position as the voxel in the planning image, the orientation of the voxel is defined by the rotor axis that defines its [1,1,1] axis.

Variable Rotation MAT Techniques

Some methods of the present disclosure employ variable speed rotation of the sample and/or magnetic field. Generally, it can be advantageous to use the largest spinning speed that a sample can tolerate in order to reduce $T_1$-induced signal losses. However, constant rotator speed techniques typically are limited by the sum of the duration of all the events in a particular sequence. For example, disclosed sequences, such as PHORMAT and LOCMAT sequences, include comparatively lengthy CHESS and WET sequences. Such disclosed sequences may have a maximum speed of 6 Hz. In particular, signal loss can occur for events with short evolution times, but comparatively long lock times.

Accordingly, the disclosed methods can include rotation rates that vary during each rotation period, thus potentially allowing the overall rotation period to be shortened. In at least some implementations, the rate of rotation for a particular event is selected to the lock period is constant and comparatively short for a particular evolution step. Varying the rotation speed may also reduce $t_1$ noise generated by changing signal losses during various lock periods when a constant spinning rate is used.

Varying the rotational speed may be implemented in any of above rotational regimes, including embodiments using one or more of a rotating sample, a rotating magnet, an electronically rotating magnetic field.

Anisotropic Susceptibility Broadening

At least some of the disclosed methods allow both anisotropic and isotropic data to be collected from a sample. Comparing the line widths of the anisotropic and isotropic spectra determines the anisotropic susceptibility broadening. Analysis of particular signals, such as signals produced by particular metabolics, can be of diagnostic value. For example, lipid methyl peaks from in vivo measurements of rat livers exhibit narrower lines in animals with hepatocarinogenesis. Narrower line widths can sometimes be attributed to malignancy, such as in sera of subjects with hepatopancreatobiliary disorders.

In some applications, LOCMAT is used to determine lipid concentrations and compositions. Changes in lipid profiles have implicated in health-impacting processes such as diabetes, hepatitis, tumor growth and malignancy, toxic responses to drugs, apoptosis, and phospholipidosis induced by inhaled airborne pollutants. It can be difficult to obtain useful information from global measurements, such as NMR spectroscopy, on sera or urine because of the general response of lipid contents and compositions. LOCMAT makes it possible to measure metabolite profiles, as well as anisotropy patterns, directly in the area of interest in a live animal, which can significantly increase the diagnostic value of NMR spectroscopy. In addition, fast-MAS measurements on excised tissues have been used to improve the evaluation of toxic effects of drugs. LOCMAT is not limited to lipid investigations, as the concentrations and changes of other metabolites can be investigated. In some embodiments chemical shift suppression is employed, such as suppression of the lipid 1.3 ppm methylene intensity to reduce $T_1$ noise arising from this relatively large peak.

MAT Techniques Providing Extended Imaging Capabilities

In some embodiments, the present disclosure provides MAT techniques with extended imaging capabilities. Such MAS techniques include the PHORMAT and LOCMAT techniques. In particular implementations, extended imaging capabilities are realized by using all or part of acquisition time for purposes other than just observing signal decay. In particular, isotropic information generated during the evolution time can be collected.

Figure 14:
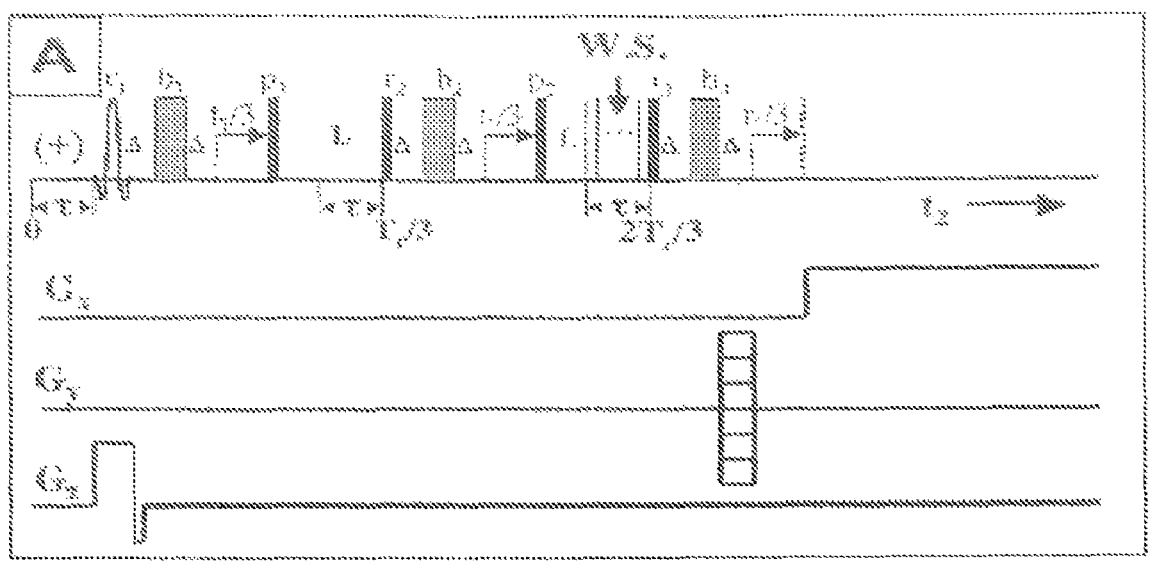
FIG. 14 is schematic representation of an embodiment of a PHORMAT RF pulse sequence that also provides chemical shift imaging.

FIG. 14 illustrates a modified PHORMAT sequence that also provides chemical shift imaging. The read pulses $r_1$-$r_3$, phase pulses $b_1$-$b_3$, and storage pulses $p_1$-$p_3$ are generally as described in conjunction with the pulse sequence of FIG. 5. However, the read pulse $r_1$ is a spatially selective pulse applied in conjunction with the slice selection gradient $G_z$. The modified PHORMAT sequence of FIG. 11 also includes a phase encoding gradient $G_y$ applied during one of the periods $\Delta$. A readout gradient $G_x$ is applied during the acquisition time $t_2$. The inclusion of the phase encoding and readout gradients allow for chemical shift imaging of the sample. This method may be particularly useful when signal averaging will be used to enhance the signal to noise ratio, as then the single-voxel and CSI measurements may use comparable measuring times.

Figure 15:
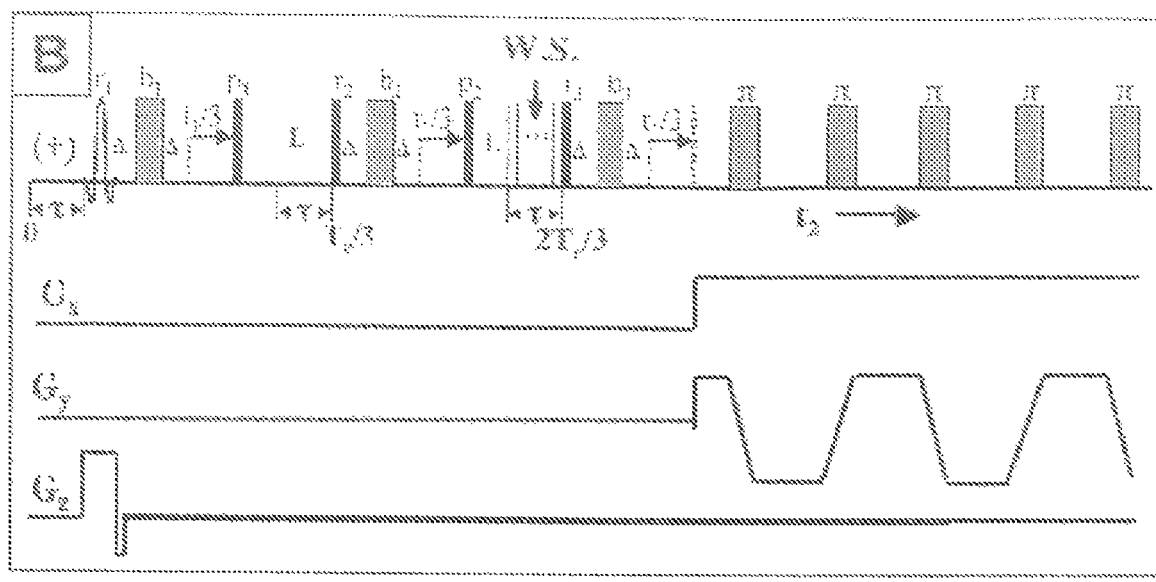
FIG. 15 is a schematic representation of an embodiment of a PHORMAT RF pulse sequence that provides data acquisition from multiple voxels.

FIG. 15 illustrates a modified PHORMAT sequence adapted to provide multiple-voxel signal acquisition. The read pulses $r_1$-$r_3$, phase pulses $b_1$-$b_3$, storage pulses $p_1$-$p_3$, and slice selection gradient $G_z$ are as described for the pulse sequence shown in FIG. 11. FIG. 12 further includes an echo planar imaging-like sequence applied during time $t_2$. The EPI sequence includes a series of $\pi$ pulses to reduce dephasing of the signal due to the different offset frequencies of the spectral lines. The EPI sequence also includes a phase encoding gradient $G_y$ and a frequency encoding gradient $G_x$. In a further implementation, the y-gradient is switched after several $\pi$ pulses rather than after each pulse. The echoes from each set of pulses can be combined to obtain both isotropic and anisotropic data.

The specific examples described below are for illustrative purposes and should not be considered as limiting the scope of the appended claims.

EXAMPLE 1

LOCMAT Using a Static Pulsed Field Gradient

Sample Preparation

The protocols for the in vivo studies were approved by Pacific Northwest National Laboratory Animal Review Board. Ten, ~70 day old female BALBc mice with a body weight of about 20 g were used for the LOCMAT experiments. Prior to spinning, the animals were anesthetized with a mixture of 0.3 ml Xylazine at a concentration of 20 mg/ml and 1.0 ml of Ketamine at a concentration of 100 mg/ml. The cocktail mixture was then administered by intraperitoneal injection at 1.4 ml/kg mouse body weight. The anesthesia lasted for 1.5-2.5 hr. When anesthetic takes effect the eyes of the animals are lubricated to prevent them from drying out.

The mouse was then placed in a special mouse holder that fits inside a rotor with an inner diameter of 34 mm that was part of a mouse-MAS-imaging probe. The residence time of a mouse in the magnet was no longer than 120 minutes, wherein fresh air and cooling were provided to promote survival. At the end of each test period the mouse was allowed to recover in a heated space and then returned to a home cage. Previous studies indicated that the mice could tolerate spinning speeds at least up to 8 Hz and at least up to 40 minutes without any apparent problems. The LOCMAT experiments were performed at a MAS speed of 4 Hz. All mice survived this procedure, with the exception of one animal that died shortly after removal from the rotor. The reason for its death is unknown, but it appears to be unrelated to spinning, since all other mice survived, many after being subjected to higher spin speeds.

Experimental

Details about the experimental set-up are described in Wind et al., "High Resolution $^1$H NMR Spectroscopy in a Live Mouse Subjected to 1.5 Hz Magic Angle Spinning," Magn. Reson. Med. 50: 1113-1119 (2003). All experiments were carried out in a 2 Tesla 30 cm horizontal bore magnet equipped with a Varian UnityPlus console extended with MR imaging capabilities. This field strength corresponds to a proton Larmor frequency of 85 MHz. For in vivo LOCMAT the mouse-MAS probe was inserted into a gradient assembly with an inner diameter of 12 cm. The mouse position in the rotor is fixed, which means that only the section of the mouse body inside the 4 cm long NMR coil could be used for the experiments. The probe was not equipped with animal monitoring sensors.

Measurements

The following procedures were used for the in vivo LOCMAT experiments. Shimming was performed on a static sample containing water. In this way only the static field inhomogeneities arising from sources outside the rotor (mainly the external field) were compensated. As explained before, is typically not performed on the mouse or the VOI in the mouse, since then the external shim coils can produce macroscopic gradients to compensate the susceptibility gradients. Since the shim gradients are static and MAS eliminates the susceptibility gradients in the isotropic dimension of the 2D spectrum, shimming on the mouse would mean that the isotropic lines are broadened by the residual shim gradients. The mouse is then imaged while it is stationary, with the rotor in a known position. Next, the VOI is selected and used to determine the gradient offset frequencies and amplitudes to select the same VOI in a rotating animal and the slice with the projection and refocusing pulses, following the procedure outlined above.

All LOCMAT 2D data on the mice were acquired using 35 $t_1$ values incremented by 1.667 ms, corresponding to an evolution spectral width of 600 Hz and a maximum evolution time of 58 msec. For each $t_1$ value the LOCMAT (+) and (−) sequence was acquired, each with 32 phase-cycling steps given in Hu et al, "Sensitivity-enhanced Phase Corrected Ultra-slow Magic Angle Turning Using Multiple-Echo Data Acquisition," J. Magn. Reson. 163: 149-162 (2003). The recycle delay time was 0.5 sec, the echo time $\Delta$ was 2 msec (measured from the center of the 180° pulse), and the acquisition time was 0.3 sec. All pulses were sinc pulses with duration 1.5 msec. The resulting total experimental time was approximately 40 minutes. Water suppression was applied during both the first and the second magnetization storage periods of the pulse sequence using 1-pulse CHESS and 4-pulse WET with total durations of 12 and 46 ms, respectively, c.f. FIG. 13.

As the duration of each LOCMAT sub-sequence has to fit within one rotor period, it follows that with these parameters a maximum MAS speed of about 6 Hz can be used. In order to reduce the stress of spinning upon the animals, a MAS speed of 4 Hz was employed. Complex 2DFT with 8192×1024 points was performed. Gaussian line broadening with characteristic times of 0.05 and 0.1 s were applied prior to FT along the acquisition and the evolution dimensions, respectively, broadening the isotropic lines by about 0.5 Hz.

In order to estimate the signal reduction during the recycle delay and the rotor period, the $T_1$ value of the largest lipid peak associated with the chain methylene protons was measured in freshly excised mouse liver (see below). In the 2 Tesla field this value was 220 ms. Assuming that the same value is found in vivo, this means that the 0.5 sec recycle delay reduces the signal by about 10% and that the 250 msec rotor period causes an additional reduction of maximal 50% (this arises for short evolution times, c.f. FIGS. 5 and 13).

The $T_1$ values of the lines arising from other metabolites and other lipid functional groups have not been measured. However, in excised rat liver it was found that in a 7 Tesla field the lipid methylene line exhibits the shortest $T_1$ value, and that the $T_1$ values of the other lines can increase by as much as a factor 2. If the same trend occurs in vivo, the used recycle delay would increase the signal attenuation to maximal 30% whereas the signal attenuation during the rotor period is reduced to minimal 30%.

Results

Phantom Sample

In order to evaluate the localization efficacy of LOCMAT and possible impact of sample rotation during the spatially selective RF and gradient pulses on the spectral quality, LOCMAT experiments were carried out on a phantom sample consisting of a rotor containing a large carrot into which a hole was drilled with its axis perpendicular to the rotor axis. A tube with an inner diameter of approximately 4 mm and filled with Silicone sealant was inserted into this hole.

Figure 16:
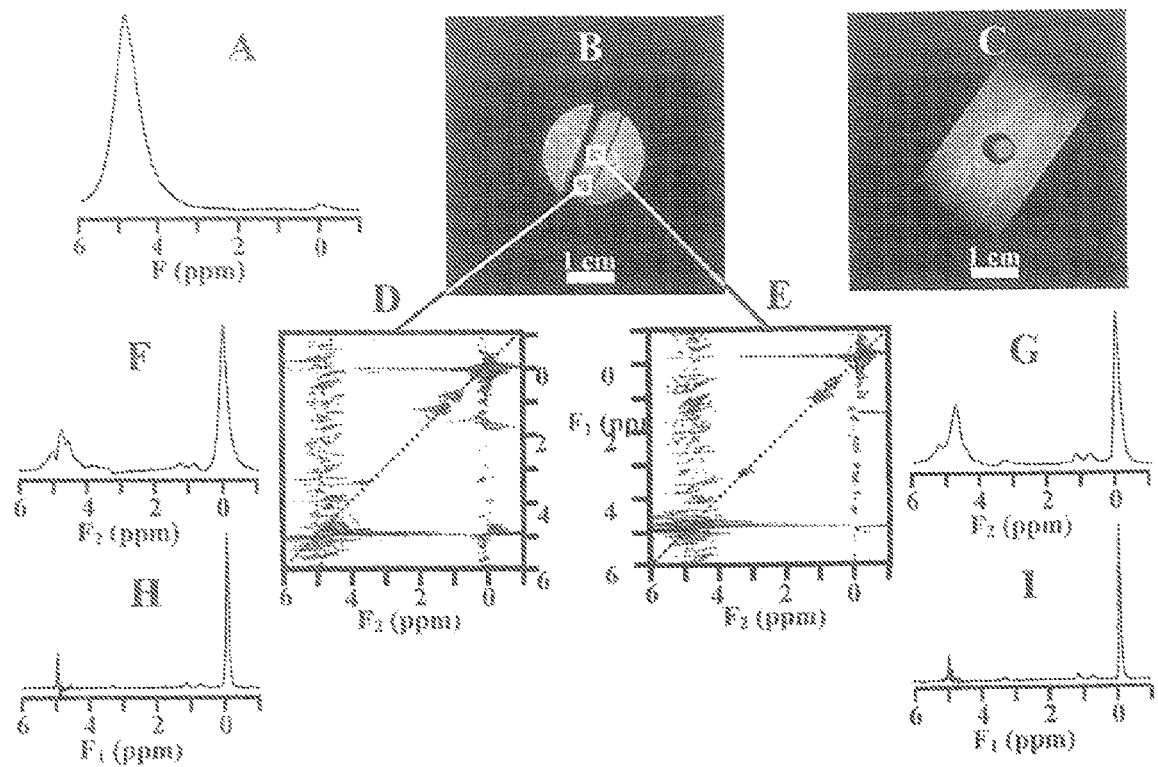
FIG. 16A shows a $^1$H spectrum of a stationary carrot obtained using conventional NMR techniques.
FIGS. 16B and 16C show, respectively, axial and transverse images of the carrot obtained using conventional MRI techniques.
FIGS. 16D and 16E show $^1$H spectra of the carrot obtained using a disclosed LOCMAT RF pulse sequence.
FIGS. 16F-16I show isotropic (H and I) and anisotropic projections (F and G) corresponding to the spectra of FIGS. 16D and 16E.

FIG. 16A shows the spectrum of the whole sample situated within the NMR coil, obtained with a simple single-pulse experiment without spinning, water suppression, or volume selection. Two lines can be distinguished, one around 4.9 ppm arising from the water in the carrot and a much smaller line (~a factor 30 smaller in height) around 0 ppm arising from the sealant. FIGS. 16B and 16C show the axial and transverse image of the sample, respectively, displaying the location of the insert (the apparent shift of the sealant along the readout direction is the well-known image distortion arising from the chemical shift difference between the water and silicone lines).

In order to measure the impact of the sample motion on the spectral quality, LOCMAT experiments were carried out on two 4×4×4 mm³ voxels in the Silicone cylinder near the rotor wall and in the middle of the sample, respectively. If the sample rotation during the pulsed field gradients were important, it may produce increased distortions in the spectrum of the voxel in the periphery. FIGS. 16D-16I show the LOCMAT results. No water suppression was applied, the MAS speed was decreased to 2.5 Hz in order to reduce the chance that the spinning centrifuges the water out of the carrot, and the number of $t_1$ increments was increased to 100, increasing the measuring time to 2.2. hrs. The other parameters were the same as given above.

FIGS. 16D and 16E show the LOCMAT 2D spectra obtained in both voxels. The various spectral lines were distributed along the diagonals of the spectra, indicated by the dotted lines, with the isotropic information along the $F_1$ dimension and the combined isotropic and anisotropic information along $F_2$. The intensities outside the diagonal along the $F_1$ direction near $F_2$ values of 4.9 and 0 ppm constitute the $t_1$ noise described above, arising from Silicone and water signals outside the voxel (the average $t_1$ noise associated with the water and Silicone signals is a factor 7 and 4 larger than the thermal noise, respectively). However, as only the signals along the diagonal are relevant, in this case the contribution of the $t_1$ noise in the area of interest, i.e., the area around the diagonal, is small. However, this noise can become relevant and even dominating the thermal noise in areas close to the peaks causing the $t_1$ noise, especially when the anisotropy broadening is large.

The $t_1$ noise contributions in the 2D spectra of both voxels were very similar, indicating that for the described experimental conditions the rotation of the sample during the volume and slice selection has little or no impact on the spectral quality. This also follows from FIGS. 16F and 16G, where the anisotropic projections of the 2D spectra of both voxels are given, and FIGS. 16H and 16I, where the corresponding isotropic spectra are displayed. In order to obtain the latter spectra the diagonal in the 2D spectrum was rotated over 45° to a direction parallel to the $F_1$ axis, thus eliminating the isotropic information along the $F_2$ direction, and a slice was taken parallel to $F_1$ through the resulting signal maxima.

In all spectra small additional lines around 0.8, 1.1, and 3.3 ppm, arising from the Silicone sealant were observed. Also, the water intensities in the spectra were significantly suppressed, especially in the isotropic spectra, indicating that the volume selection works properly: the residual water intensity in the isotropic spectra is about a factor 5 less than the 0 ppm Silicone line, which in its turn is approximately a factor 5 less than that of the whole Silicone cylinder, and as the latter signal is a factor 30 less than the water line. Thus, it follows that LOCMAT suppresses the outside water signal by a factor of 750.

In Vivo and Ex Vivo LOCMAT on a Mouse

Figure 17:
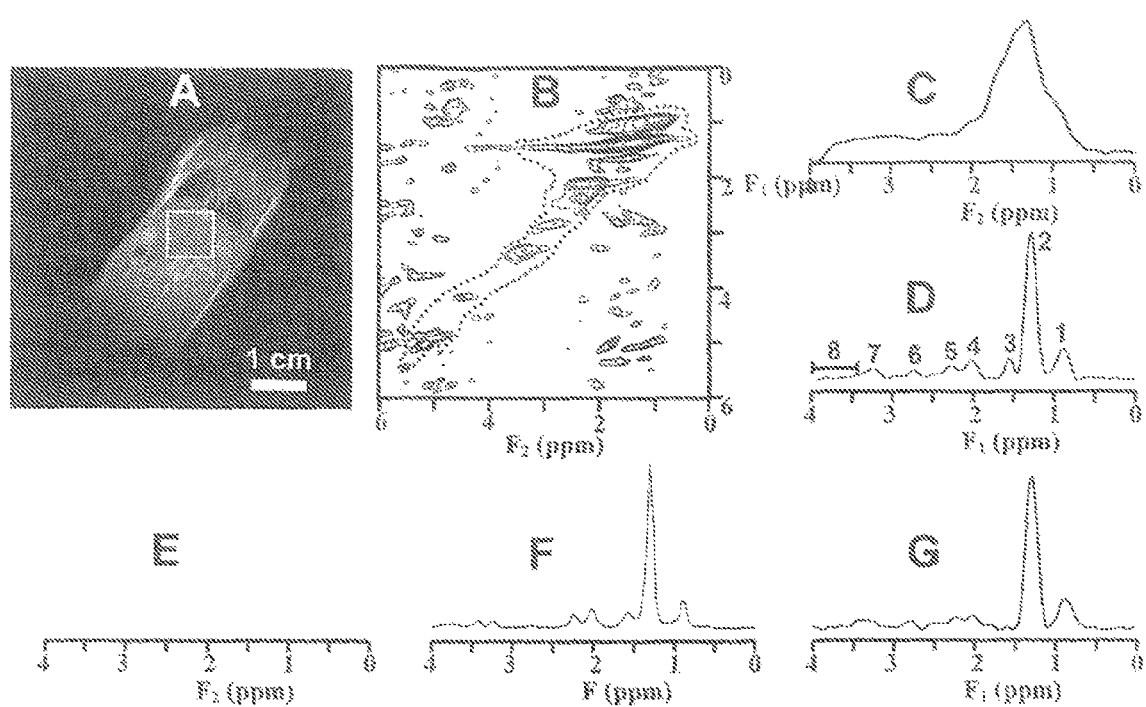
FIG. 17A shows a coronal image of a stationary mouse obtained using conventional MRI techniques.
FIGS. 17B-17E show $^1$H spectra of the mouse obtained using a disclosed LOCMAT RF pulse sequence.
FIG. 17F shows a $^1$H spectrum of the mouse obtained using a PASS RF pulse sequence.
FIG. 17G shows a $^1$H spectrum of the freshly excised liver of the mouse obtained using a disclosed LOCMAT RF pulse sequence.

In vivo phase-sensitive 85 MHz ¹H LOCMAT MR spectra were obtained in 8×8×8 mm³ and 6×6×6 mm³ voxels in the liver and a 10×10×10 mm³ voxel around the heart of a mouse subjected to 4 Hz MAS. FIG. 17 shows the results obtained in the liver. FIG. 17A shows the MR coronal image of the mouse with the selected 8×8×8 mm³ voxel. FIG. 17B displays the PHORMAT 2D spectrum. The signal information along the diagonal is approximately inside the area indicated by the dotted boundary, and the intensities outside this area depict the $t_1$ noise.

FIG. 17C shows the anisotropic projection, and FIG. 17D shows the isotropic spectrum, both obtained in the same way as the corresponding spectra of the phantom sample. The spectra are dominated by signals arising from mobile lipids, and the line assignments are: 1: Lipids $CH_3$ terminal; 2: Lipids —$CH_2$—$CH_2$—$CH_2$—; 3: Lipids $CH_2CH_2CO$; 4: Lipids $CH=CH$—$CH_2$—$CH_2$; 5: Lipids —$CH_2$—$CH_2$—$COO$; 6: Lipids $CH=CH$—$CH_2$—$CH=CH$; 7: Choline, Betaine methyl; 8 (~3.4-3.8 ppm): glucose and glycogen.

FIG. 17E shows the susceptibility broadening associated with the lipid methylene line 2, obtained by taking a slice parallel to the $F_2$ axis at $F_1$=1.3 ppm. The broadening resembles an axially symmetrical tensor and has a width of about 0.6 ppm. The width and shape of this pattern may provide information about the geometries and susceptibilities of the various compartments inside the VOI responsible for this broadening. The isotropic line width of line 2 is about 0.16 ppm. It follows that even in the relatively low 2T field a substantial line narrowing of about a factor 4 is obtained with PHORMAT.

FIG. 17F shows the isotropic spectrum obtained ex vivo with 300 MHz ¹H 40 Hz PASS on freshly excised mouse liver tissue. The spectrum closely resembles the in vivo spectrum shown in FIG. 17D. The spectral resolution in the ex vivo spectrum is better than in the in vivo spectrum, which is due to the higher field employed. In principle the isotropic line width is independent of the field strength so the separation between the lines is proportional to $B_0$. This means that if in vivo LOCMAT had been performed in a 7T field, the spectrum should exhibit a resolution at least as good as the ex vivo one.

Finally, FIG. 17G shows the isotropic LOCMAT spectrum obtained under identical conditions as the one shown in FIG.

5D, but now with a 6×6×6 mm³ VOI in the liver, with the same center as the 8×8×8 mm³ voxel. Although similar features can be observed as in spectrum 5D, the smaller lines in the spectrum become similar in magnitude to the noise, so that in the liver a VOI of 200-500 μl was chosen in order to obtain a spectrum with an adequate SNR. The noise in the isotropic spectra consists mainly of $t_1$ noise that leaked into the area of interest. It was found that the noise in the isotropic spectrum was a factor 3-5 larger than the thermal noise measured in parts of the 2D spectrum that were free of $t_1$ noise. Hence, if the $t_1$ noise can be reduced to values small compared with the thermal noise, the minimum VOI could be reduced to values of 100 μl or less.

Figure 18:
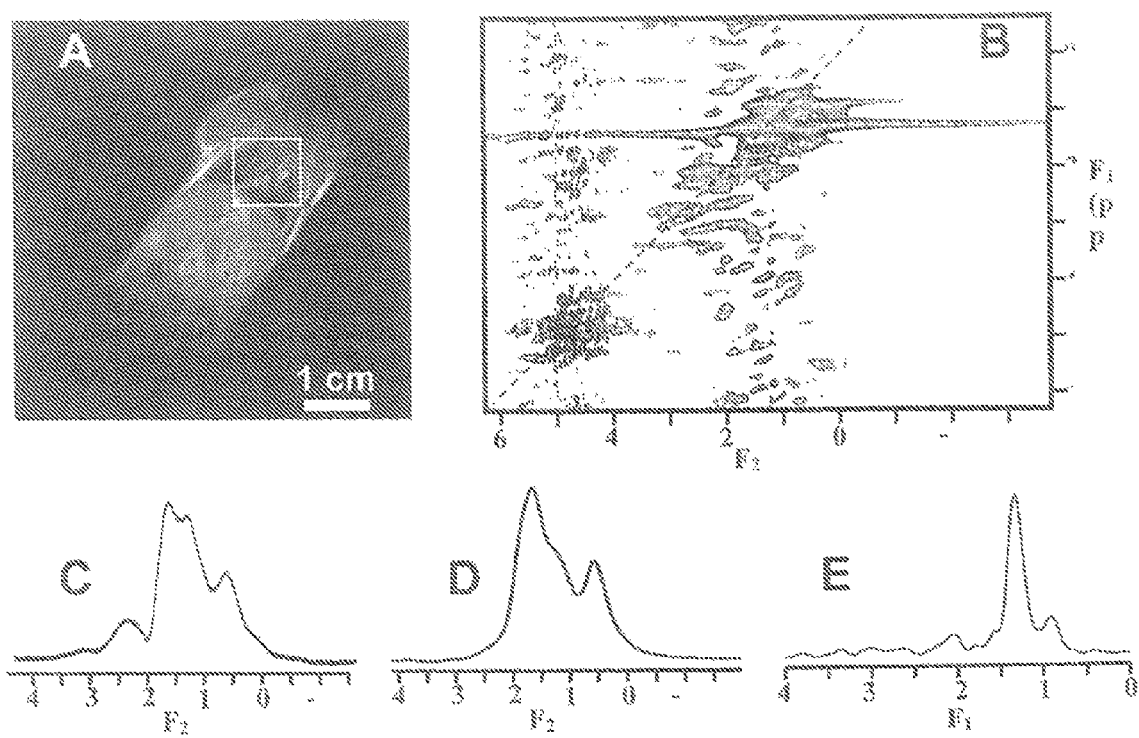
FIG. 18A shows a coronal image of a mouse obtained using standard MRI techniques.
FIGS. 18B-18E show $^1$H spectra of the mouse obtained using a disclosed LOCMAT RF pulse sequence.

FIG. 18A shows the image of a different (live) mouse and the 10×10×10 mm³ VOI containing the heart and part of the lung. FIGS. 18B-18E present the corresponding proton LOCMAT results. A comparatively large volume was chosen to ensure that the beating heart stayed within the VOI.

FIG. 18B displays the 2D spectrum. As in the liver spectrum, lipids also dominate this spectrum, but in contrast to liver the anisotropic lines are much broader and display several maxima. These lines are illustrated in FIGS. 18C and 18D, where the anisotropic projection (C) and the anisotropic line associated with the 1.3 ppm lipid methylene line (D) are given. The overall width of the latter spectrum is close to 2 ppm and exhibits two maxima at 0.5 and 1.6 ppm.

It is unlikely that these maxima arise from intra- and inter-myocellular lipids in the heart muscle, as the chemical shift difference between these maxima is significantly larger than that reported in other muscles. Instead, the susceptibility pattern is likely due to the relatively large susceptibility difference between the heart and the surrounding lung cavity. The pattern's shape may reflect the shape and orientation of the heart and heart components. For example, in a theoretical and experimental investigation of susceptibility broadenings induced in water contained in plastic compartments of different shapes, it has been reported that broad lines (with a width up to 8 ppm) and many different shapes (including shapes exhibiting two maxima for cubic water shells) can result.

The isotropic spectrum of the heart is shown in FIG. 18E. This spectrum was obtained by rotating the diagonal again and projecting a 2 ppm wide band in the 2D spectrum onto the $F_1$ axis. The lipid lines display single maxima, and the spectrum resembles that of the liver. The width of the isotropic 1.3 ppm lipid methylene line is about 0.2 ppm, and it follows that LOCMAT narrows this line by a factor 10.

As mentioned before, the LOCMAT experiment is not triggered to the cardiac or respiratory motions, and during each LOCMAT sequence the heart beats several times. The overall susceptibility pattern does not appear to be changing significantly during the contraction and expansion of the heart or the lung, as otherwise the susceptibility broadening would not be averaged out at the start of an acquisition. In fact, the isotropic line is only 0.04 ppm broader than the corresponding line in the liver, indicating that the spectra are only slightly blurred as a result of the cardiac and/or respiratory motions. However, the isotropic spectrum contains significantly larger contributions from the $t_1$ noise than the corresponding spectrum in the liver. The $t_1$ noise is due to the large width of the lipid methylene line along the $F_2$ dimension, as this also increases the width of the spurious signals responsible for the $t_1$ noise and, henceforth, the 'leakage' of this noise into the diagonal area of the 2D spectrum containing the signal information. This effect can be seen by comparing the 2D spectra and the $t_1$ noise in FIGS. 16D, 16E, and 17B, where the widths of the anisotropic lines and, henceforth the $t_1$ noise, gradually increase.

Figure 19:
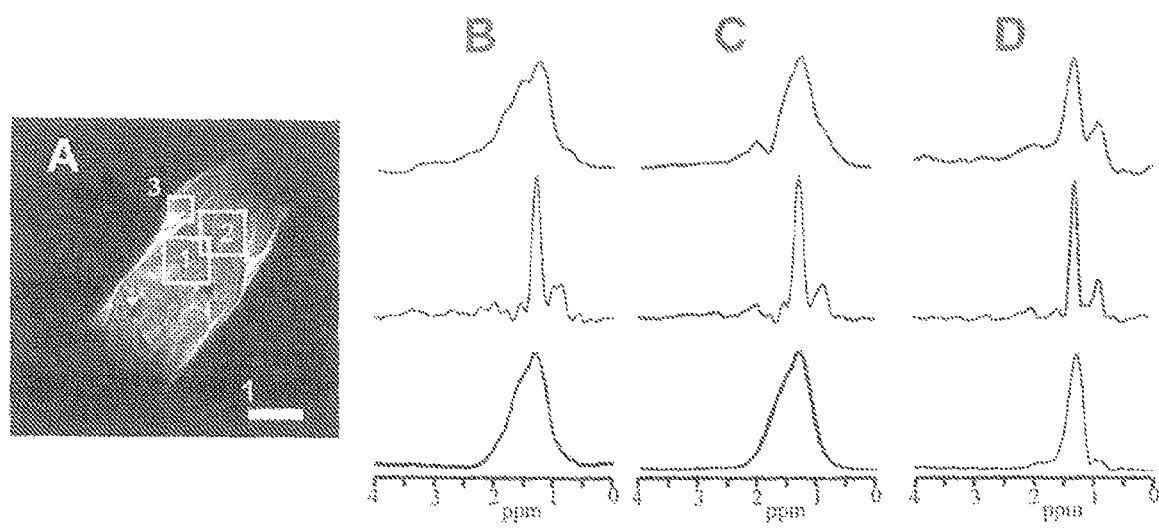
FIG. 19A shows a coronal image of the sacrificed mouse of FIG. 18 using standard MRI techniques.
FIGS. 19B-19D show $^1$H spectra of the sacrificed mouse using a disclosed LOCMAT RF pulse sequence.

In order to evaluate the impact of cardiac, respiratory, and other motions in the animal on the LOCMAT performance, similar experiments were performed on a dead mouse, a few hours after sacrificing the animal by $CO_2$ asphyxiation. The results are shown in FIG. 19. FIG. 19A shows the MR image, and FIGS. 19B, 19C, and 19D display LOCMAT spectra obtained in 8×8×8 mm³ voxels in the liver (VOI 1 in FIG. 19A) and the heart (VOI 2), and a 4×4×4 mm³ voxel in the muscle area of the front leg (VOI 3), that also contains body fat (the latter experiment was not carried out in vivo). The top spectra display the overall anisotropic projections, the middle spectra are the isotropic spectra, and the lower spectra denote the anisotropy spectra corresponding to the 1.3-ppm lipid methylene lines.

As shown in FIGS. 17 and 19, the in vivo and ex vivo liver spectra are similar. The same is true for the $t_1$ noise contributions, indicating that at least first order motions do not cause this noise. The situation is different for the heart. Although the in vivo and ex vivo isotropic spectra are similar again (albeit with a slightly better spectral resolution in the ex vivo spectrum), the broad multi-maxima susceptibility patterns have disappeared in the ex vivo spectra. In fact, their spectral shapes are similar to the ones obtained in the liver. Hence the susceptibility gradients are significantly reduced, probably as a result of post mortem lung deflation and partial filling of the lungs with fluids.

Finally, the results obtained in the muscle/fat voxel, FIG. 19D, show that it is possible to measure an isotropic spectrum with adequate SNR in a voxel as small as 64 μl. The anisotropic broadening is relatively small, at least a factor 2 smaller than that observed in the liver and the heart, resulting in decreased $t_1$ noise. At present $t_1$ noise is the limiting factor in the LOCMAT sensitivity and not thermal noise.

Discussion

This example illustrates that excellent volume selection is obtained and that, in a live mouse even without respiratory or cardiac triggering in a 2 T magnetic field, the widths of metabolite lines in the liver and the heart are reduced by a factor 4 and 10, respectively. This spectral resolution should further improve in higher fields.

This enhanced spectral resolution makes it possible to analyze the metabolic content in arbitrary areas in the body in much more detail than is generally possible without spinning. Moreover, an additional unique feature of the LOCMAT methodology is that the anisotropic susceptibility broadening is determined for the individual metabolite lines. These susceptibility patterns could be of additional biomedical value.

In excised liver and other tissues, both the anisotropic and isotropic line widths decrease with increasing post mortem time, presumably as a result of tissue degradation. The same phenomenon might occur in vivo as a result of, e.g., necrosis in a tumor. In vivo LOCMAT can provide additional information to improve the diagnosis of disease or the evaluation of therapy efficacy. Susceptibility patterns of the heart metabolites may be sensitive to the health status of the lung and/or heart.

Respiratory- and/or cardiac-triggered LOCMAT may be used to further reduce the $t_1$ noise in motion-sensitive areas and to measure the anisotropy patterns of the heart during the systolic and diastolic intervals. The anisotropy patterns might be of additional medical significance. If the $t_1$ noise can be reduced to values below the thermal noise, LOCMAT on VOIs of 50-100 µl in arbitrary areas in live mice in the 2 T field are possible. VOIs may become as small as 10 µl in a 12 T field.

EXAMPLE 2

LOCMAT Using Rotating Pulsed Field Gradients

To select a particular voxel, a 2D scout image with its image plan perpendicular to the axis of sample rotation was acquired. Such a scout image can be acquired using the modified version of a standard 2D spin-echo MRI pulse sequence given in FIG. 11 on a slowly rotating sample.

Figure 20:
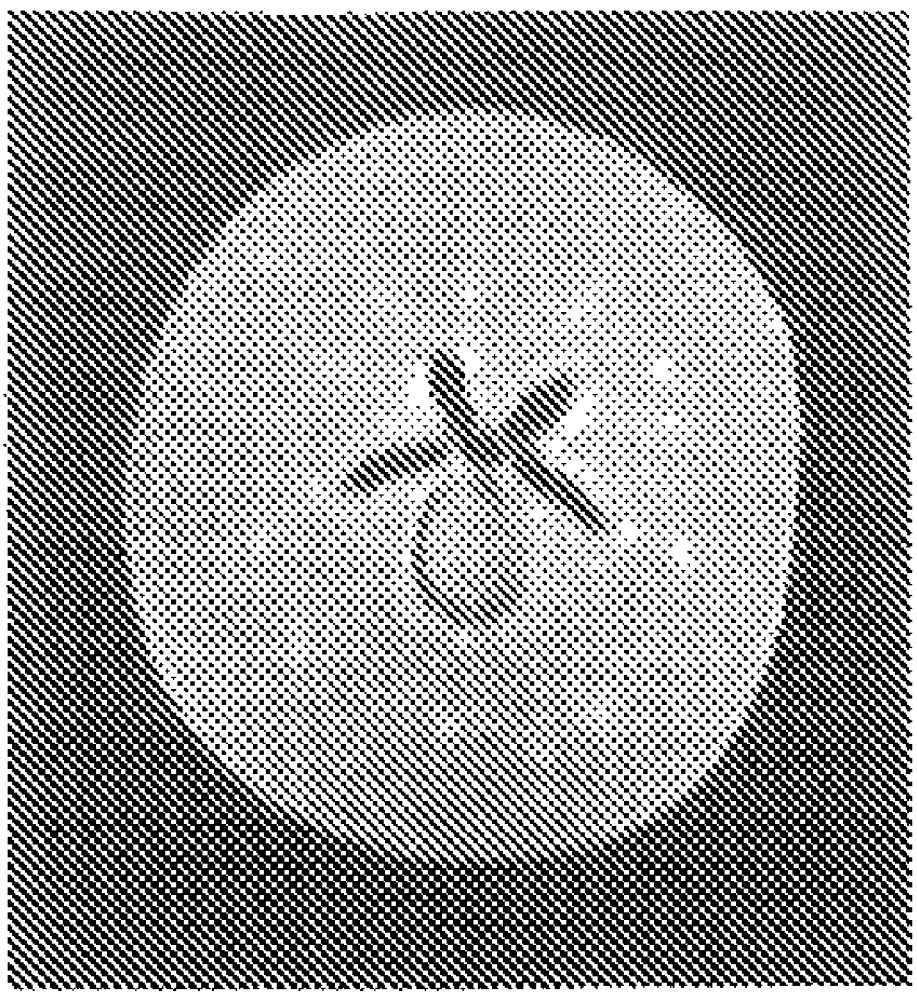
FIG. 20 shows a $^1$H MRI scout image of a crab apple obtained using a disclosed imaging sequence for spinning samples.

An example is illustrated in FIG. 20 using a crab apple and a sample spinning rate of 1.5 Hz. The slice thickness of the imaging was 2 mm. In FIG. 20, a seed and air spaces inside the apple are clearly seen without significant motion blurring.

Figure 21:
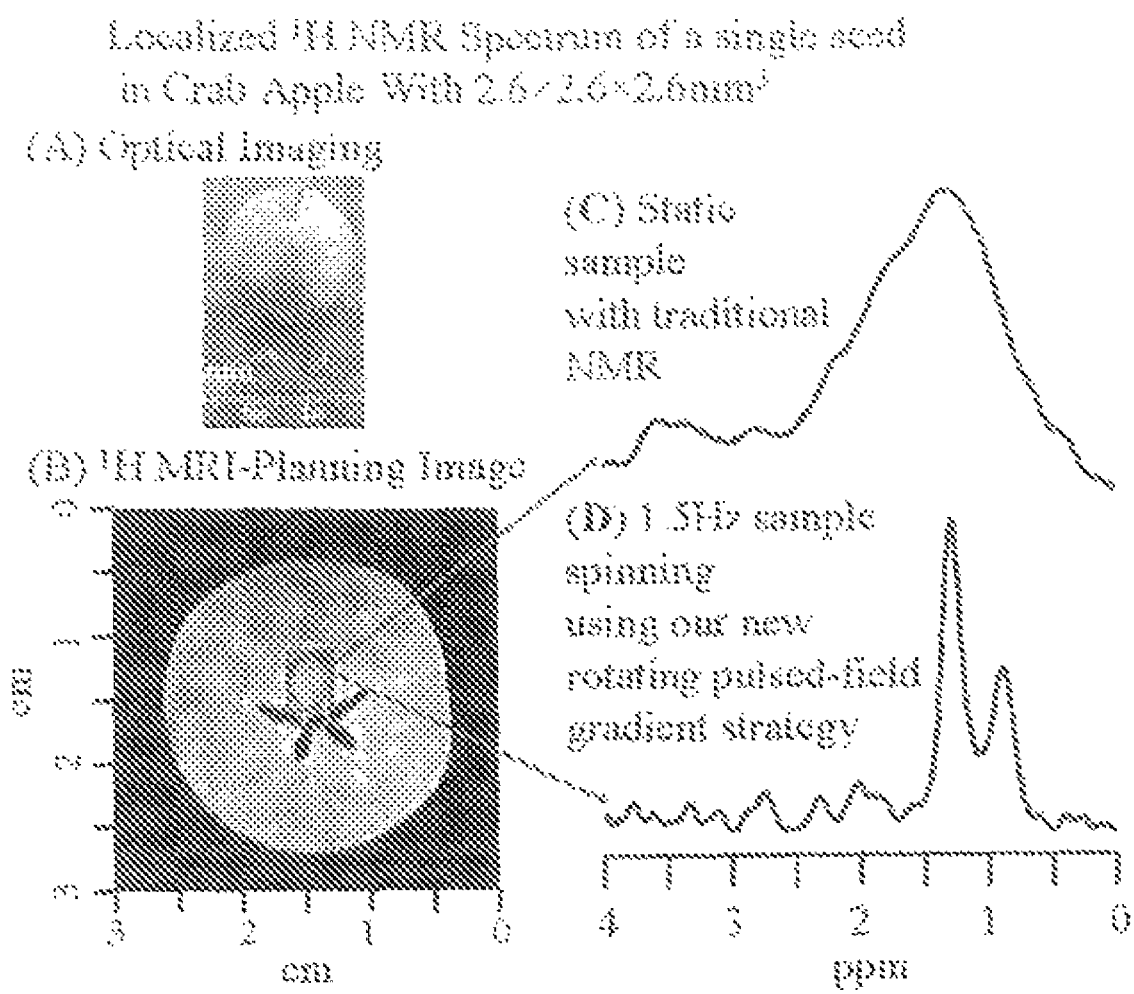
FIG. 21A shows an optical image of the crab apple of FIG. 20 and seeds from the crab apple.
FIG. 21B shows a MRI image of the rotating crab apple obtained using a disclosed MRI sequence.
FIGS. 21C and 21D show $^1$H NMR spectra obtained using conventional techniques and a disclosed LOCMAT technique, respectively.

The performance test of LOCMAT using rotating pulsed field gradients is demonstrated in FIG. 21 using a crab apple. The diameter of the crab apple (FIG. 21A) is roughly 20 mm. The apple contains two seeds (the seeds were pictured after the study when the apple was crushed and seeds taken out). The dimension of one seed is about 2.6 mm, as shown in FIG. 21A. The rotating scout planning image is shown in FIG. 21B (same as FIG. 20).

The LOCMAT technique was performed using the sequence shown in FIG. 8. The echo time ($\Delta$) and the recycle delay times were 850 µs and 1 s, respectively. The free-induction decays in the acquisition dimension ($t_2$) contained 3008 complex points and were transformed to spectra with a spectral width of 5 kHz. The 2D data were collected using 30 $t_1$ steps, incremented by 1.667 ms, corresponding to a maximum evolution time of 50 ms and an evolution spectral width of 600 Hz. 2D data sets were acquired with the (+) and the (−) LOCMAT pulse sequences, shown in FIG. 8, using a total of 64 scans for each $t_1$ value. The sinc 90° and 180° pulse width was 600 µs. Water suppression was achieved using CHESS during the first lock period "L" and "WET" during the second lock period "L". The sample spinning rate was 1.5 Hz.

FIG. 21C shows the water suppressed localized $^1$H NMR spectrum of the seed on a static sample using a voxel size of 2.6×2.6×2.6 mm$^3$. This spectrum was obtained using the first increment of the LOCMAT sequence in FIG. 5. FIG. 21C is essentially featureless containing a broad lipid peak.

On the other hand the rotating PFG LOCMAT spectrum, shown in FIG. 21D, shows remarkable resolution enhancement. This spectrum was obtained at a sample spinning rate of 1.5 Hz and a voxel size of 2.6×2.6×2.6 mm$^3$. The lipid methyl group at about 0.9 ppm is well separated from the lipid long chain $CH_2$ protons at 1.28 ppm. Also many other peaks located between 1.5 and 4 ppm are observed.

The rotating PFG LOCMAT technique was also applied to a mouse. As before, a rotating oblique scout image was acquired at the location of the liver. MRI images were acquired using the pulse sequence in FIG. 11 and at sample spinning rates of 1.5 Hz and 4 Hz. Static $^1$H NMR spectrum were recorded for the localized voxel at the lung with a voxel size of 6×6×6 mm$^3$. The rotating PFG $^1$H LOCMAT spectrum at the liver was acquired with voxel size of 5×5×5 mm$^3$ a sample spinning rate of 4 Hz. The LOCMAT spectra were acquired using similar experimental parameters as those given in used in the experiment summarized in FIG. 21, except 30 $t_1$ increments were acquired for FIG. 22(e) and 23 $t_1$ increments were acquired for FIG. 22(f).

Figure 22:
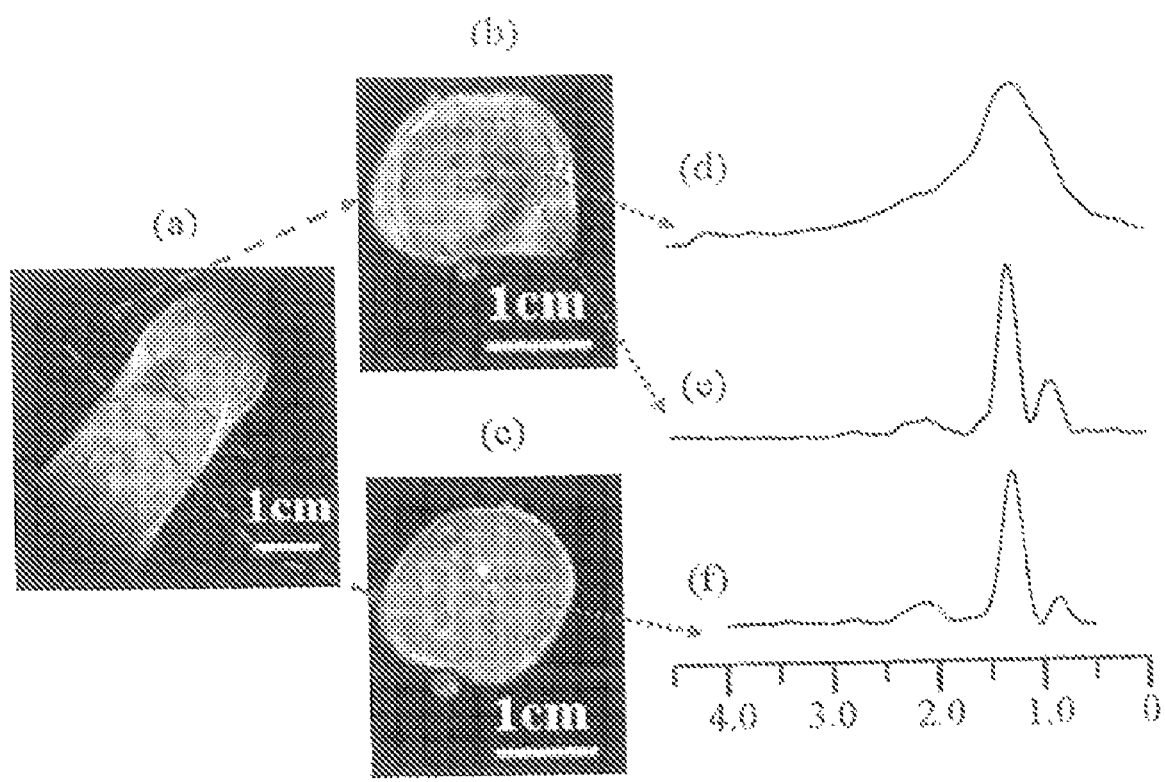
FIGS. 22A-22C show $^1$H MRI images of a mouse obtained using a disclosed MRI sequence for rotating samples.
FIG. 22D shows a static $^1$H NMR spectrum the lung of the mouse.
FIGS. 22E and 22F show $^1$H NMR spectra of the mouse lung and liver, respectively, using a disclosed LOCMAT RF pulse sequence employing rotating pulsed field gradients.

FIG. 22 summarizes the $^1$H NMR spectra obtained on a live C57BL/6 mouse with the using of the rotating PFG LOCMAT. FIG. 22A presents a sagital image acquired with the image plane parallel to the axis of the sample rotation. From this image two scout oblique images with one located at the lung (FIG. 22B) and the other located at the liver (FIG. 22C) were planned. Both scout images have their respective image plan perpendicular to the axis of the sample rotation. Voxel sizes of 6×6×6 mm$^3$ were planned at the lung and 5×5×5 mm$^3$ at the liver for the rotating PFG LOCMAT.

FIG. 22D shows the static $^1$H NMR spectrum for the localized voxel at the lung. This spectrum is essentially featureless due to the line broadening from the large magnetic susceptibility variations at the lung. FIG. 22E shows the corresponding rotating PFG $^1$H LOCMAT of the same voxel acquired at a sample spinning rate of 4 Hz. Significant resolution enhancement is achieved. Similar results are obtained with localized voxel at the liver, i.e., FIG. 22F, where the voxel size is reduced to 5×5×5 mm$^3$.

Discussion

LOCMAT with rotating pulsed field gradient (PFG) has been demonstrated using a LOCMAT experiment where only the angle "φ", a traditional Euler angle to define the sample rotation in the laboratory frame, need be changed for each PFG. This angle is easy to calculate based on the timing of the gradient and the sample rotation speed.

The rotating PFG strategy simplifies LOCMAT methods since the voxel planning can be directly obtained from a rotating scout image using traditional spectrometer planning software. Additionally, slice selection on the three mutually perpendicular slices that define a voxel are reinforced at least two times during the LOCMAT experiment, i.e., the two slices that are parallel to the rotor axis are selected two times consecutively for each, while the slice perpendicular to the axis of sample rotation is selected four times.

One potential advantage of the rotating PFG strategy over a static $G_z$ gradient is that the voxel selection can be simplified using a rotating PFG. This is because in the one static $G_z$ PFG LOCMAT, the slices defining the voxel are actually only selected once by the three read pulses that are spaced at ⅓ of the rotor periods while all the rest of the pulses, including the projection and the π pulses, have oblique slice selection with the slice plan perpendicular to the axis of the sample rotation. Therefore, in the one static $G_z$ gradient LOCMAT, the signal from outside of the voxel but within the oblique slice may contribute to increased noise in the 2D spectrum.

In rotating PFG, a voxel size of 6×6×6 mm$^3$ at the lung and 5×5×5 mm$^3$ at the liver can be obtained successfully with LOCMAT in a live mouse and at a magnetic field of 2T. These voxel sizes are smaller than those used in studies employing one static $G_z$-gradient, where voxel size 12×12×12 mm$^3$ were used at the lung and 6×6×6 mm$^3$ was used at the liver.

Further implementations of the rotating PFG LOCMAT may make each gradient truly rotating during the period of gradient. Currently each PFG is treated as static by assuming the sample spinning rate is very slow and the length of the gradient is sufficiently short. Truly rotating gradients may further improve voxel selection and eliminate the motion blurring effects.

It is to be understood that the above discussion provides a detailed description of various embodiments. The above descriptions will enable those skilled in the art to make many departures from the particular examples described above to provide apparatuses constructed in accordance with the present disclosure. The embodiments are illustrative, and not intended to limit the scope of the present disclosure. The scope of the present disclosure is rather to be determined by the scope of the claims as issued and equivalents thereto.

The invention claimed is:

1. A method of performing a magnetic resonance analysis of a sample comprising:
   placing a sample in a radio frequency field and a magnetic field having a static field direction;
   rotating the sample or the magnetic field about a rotational axis, the rotational axis being disposed at an angle of about 54°44' relative to the static direction;
   selecting a region of the sample, thus providing a selected region of the sample;
   pulsing the radio frequency to provide a pulse segment comprising:
      three spatially selective read pulses;
      two spatially selective storage pulses; and
      three spatially selective phase pulses;
   collecting data representative of the selected region of the sample generated by the pulsed radio frequency; and
   wherein the pulsing further comprises a PHORMAT pulse sequence to isolate a particular voxel of interest.

2. The method of claim 1, wherein pulsing the radio frequency to provide the spatially selective read pulses comprises applying a magnetic gradient parallel to the static direction.

3. The method of claim 2, wherein pulsing the radio frequency further comprises applying a magnetic gradient perpendicular to the rotational axis.

4. The method of claim 1, wherein pulsing the radio frequency further comprises applying a magnetic gradient parallel to the rotational axis.

5. The method of claim 1, further comprising synchronizing at least one of the spatially selective read pulses, the spatially selective storage pulses, and the spatially selective phase pulses with the rotation of the sample or the magnetic field.

6. The method of claim 1, wherein pulsing the radio frequency further comprises synchronizing a magnetic gradient with the rotation of the sample or the magnetic field.

7. The method of claim 6, wherein pulsing the radio frequency further comprises applying a magnetic gradient perpendicular to the rotational axis.

8. The method of claim 7, wherein pulsing the radio frequency further comprises applying a magnetic gradient parallel to the rotational axis.

9. The method of claim 1, wherein pulsing the radio frequency further comprises applying a magnetic gradient parallel to the rotational axis during the spatially selective storage radio frequency pulses.

10. The method of claim 1, wherein the sample or magnetic field is rotated at a rate sufficiently slowly such that pulsing a static field gradient can be treated as pulsing the field gradient of a fixed sample and a fixed magnetic field.

11. The method of claim 1, wherein the sample is rotated at a rate of less than 100 Hz.

12. The method of claim 1, wherein the sample is rotated at a rate of about 10 Hz or less.

13. The method of claim 1, wherein selecting a region of the sample comprises obtaining a first magnetic resonance analysis of the sample.

14. The method of claim 13, wherein the first magnetic resonance analysis of the sample comprises a magnetic resonance image.

15. The method of claim 1, wherein selecting a region of the sample comprises determining coordinates of the selected region, further comprising synchronizing a magnetic gradient with the rotation of the sample or the magnetic field based on the coordinates.

16. The method of claim 15, wherein selecting a region of the sample involves a first processor, further comprising outputting the coordinates to a second processor, wherein the second processor synchronizes the magnetic gradient with the rotation of the sample or the magnetic field.

17. The method of claim 1, wherein pulsing the radio frequency further comprises saturating at least a portion of the sample outside the selected region of the sample.

18. The method of claim 1, wherein the rotation rate is varied while the magnetic resonance analysis is being performed.

19. The method of claim 1, further comprising rephasing a read signal during acquisition of the read signal and varying a magnetic read gradient in order to generate a magnetic resonance analysis of a plurality of regions of the sample.

20. The method of claim 1, wherein the spatially selective read pulses are frequency selective.

21. The method of claim 1, further comprising generating a magnetic resonance analysis of isotropic and anisotropic data.

22. The method of claim 1, further comprising generating a magnetic resonance analysis of the irradiated region comprising determining anisotropic susceptibility broadening for a chemical species present in the selected region.

23. The method of claim 22, further comprising diagnosing a disease or physiological condition based on the anisotropic susceptibility broadening.

24. A method of performing a magnetic resonance analysis of a sample comprising:
   placing a sample in a radio frequency field and a main external magnetic field;
   selecting a region of the sample, thus providing a selected region of the sample;
   rotating the sample or the main external magnetic field about a rotational axis, the rotational axis being disposed at an angle of about 54°44' relative to the main external magnetic field direction;
   pulsing the radio frequency to provide a magic angle turning pulse sequence comprising:
      applying a rotating pulsed magnetic read gradient perpendicular to the axis of rotation and pulsing the radio frequency to provide three spatially selective read pulses in order to isolate a particular voxel of interest, wherein the pulsed rotating gradient is synchronized with the sample or main magnetic field rotation and at least one read pulse;
      applying a rotating pulsed magnetic storage gradient perpendicular to the axis of rotation and pulsing the radio frequency to provide two spatially selective storage pulses to isolate a particular voxel of interest, wherein the pulsed rotating gradient is synchronized with the sample or main magnetic field rotation and at least one storage pulse;
      applying a pulsed magnetic storage gradient parallel to the axis of rotation and pulsing the radio frequency to provide three spatially selective phase pulses; and
   generating a magnetic resonance analysis of the selected region.

25. The method of claim 24, further comprising synchronizing at least one of the read gradient, phase gradient, and the storage gradient with the rotation of the sample or the magnetic field.

26. The method of claim 24, wherein applying a magnetic read gradient comprises applying a plurality of magnetic read gradients in a plurality of orthogonal directions.

27. The method of claim 1, further comprising applying at least one rotating pulse magnetic field gradient during each of the spatially selective read pulses, spatially selective storage pulses, and spatially selective phase pulses.

28. The method of claim 1, wherein pulsing the radio frequency further comprises applying a magnetic gradient parallel to the rotational axis during the spatially selective read pulses.

29. The method of claim 1, wherein pulsing the radio frequency further comprises applying a magnetic gradient parallel to the rotational axis during the spatially selective phase pulses.

* * * * *